United States Patent
Li et al.

(10) Patent No.: US 11,651,531 B2
(45) Date of Patent: May 16, 2023

(54) SYSTEMS AND METHODS FOR MAGNETIC RESONANCE IMAGING

(71) Applicant: SHANGHAI UNITED IMAGING HEALTHCARE CO., LTD., Shanghai (CN)

(72) Inventors: Guobin Li, Shanghai (CN); Zhenkui Wang, Shanghai (CN)

(73) Assignee: SHANGHAI UNITED IMAGING HEALTHCARE CO., LTD., Shanghai (CN)

( * ) Notice: Subject to any disclaimer, the term of this patent is extended or adjusted under 35 U.S.C. 154(b) by 505 days.

(21) Appl. No.: 16/665,116

(22) Filed: Oct. 28, 2019

(65) Prior Publication Data

US 2020/0364908 A1    Nov. 19, 2020

(30) Foreign Application Priority Data

May 14, 2019 (CN) .......................... 201910398929.7

(51) Int. Cl.
  *G06T 11/00* (2006.01)
  *G01R 33/561* (2006.01)
  *G01R 33/56* (2006.01)
  *G01R 33/48* (2006.01)
  (Continued)

(52) U.S. Cl.
  CPC .......... *G06T 11/003* (2013.01); *G01R 33/483* (2013.01); *G01R 33/4818* (2013.01); *G01R 33/5608* (2013.01); *G01R 33/5618* (2013.01); *G01R 33/5673* (2013.01); *G01R 33/5676* (2013.01); *G06T 2210/41* (2013.01)

(58) Field of Classification Search
  CPC .............. G06T 11/003; G06T 2210/41; G01R 33/4818; G01R 33/483; G01R 33/5608; G01R 33/5618; G01R 33/5673; G01R 33/5676; G01R 33/56509; G01R 33/561; G01R 33/56308
  See application file for complete search history.

(56) References Cited

U.S. PATENT DOCUMENTS

| | | | |
|---|---|---|---|
| 9,778,336 B2 | 10/2017 | Polimeni et al. | |
| 10,803,631 B2* | 10/2020 | Li | G06N 3/08 |
| 11,120,584 B2* | 9/2021 | Li | G06T 11/006 |

(Continued)

FOREIGN PATENT DOCUMENTS

CN    104027113 A    9/2014

OTHER PUBLICATIONS

Karani, Neerav, et al. "An image interpolation approach for acquisition time reduction in navigator-based 4D MRI." Medical Image Analysis 54 (Feb. 2019): 20-29. (Year: 2019).*

(Continued)

*Primary Examiner* — Rishi R Patel
(74) *Attorney, Agent, or Firm* — Metis IP LLC

(57) ABSTRACT

The present disclosure relates to systems and methods for magnetic resonance imaging. The method may include obtaining primary imaging data associated with a region of interest (ROI) of a subject and obtaining secondary data associated with the ROI. The method may also include determining secondary imaging data based on the secondary data by using a trained model. The method may further include reconstructing a magnetic resonance image based on the primary imaging data and the secondary imaging data.

18 Claims, 14 Drawing Sheets

(51) Int. Cl.
  *G01R 33/567* (2006.01)
  *G01R 33/483* (2006.01)

(56) References Cited

U.S. PATENT DOCUMENTS

| | | | |
|---|---|---|---|
| 11,232,558 B2* | 1/2022 | Liu | G16H 30/20 |
| 2007/0016002 A1 | 1/2007 | Mayer et al. | |
| 2008/0012563 A1 | 1/2008 | Weiss et al. | |
| 2011/0128000 A1 | 6/2011 | Harvey | |
| 2014/0009156 A1 | 1/2014 | Doneva et al. | |
| 2014/0035577 A1 | 2/2014 | Blumhagen et al. | |
| 2015/0015691 A1 | 1/2015 | Forman et al. | |
| 2015/0310299 A1* | 10/2015 | Goto | G06V 10/44 |
| | | | 382/128 |
| 2016/0041248 A1 | 2/2016 | Chen et al. | |
| 2017/0139026 A1* | 5/2017 | Beck | A61B 5/7207 |

OTHER PUBLICATIONS

E. M. Haacke et al., A fast, Iterative, Partial-Fourier Technique Capable of Local Phase Recovery, Journal of Magnetic Resonance, 92:126-145, 1991.

Daniel K. Sodickson et al., Simultaneous Acquisition of Spatial Harmonics (SMASH): Fast imaging with Radiofrequency Coil Arrays, Magnetic Resonance in Medicine, 38:591-603, 1997.

Klaas P. Pruessmann et al., SENSE: Sensitivity Encoding for Fast MRI, Magnetic Resonance in Medicine, 42:952-962, 1999.

Mark A. Griswold et al., Generalized Autocalibrating Partially Parallel Acquisitions (GRAPPA), Magnetic Resonance in Medicine, 47:1202-1210, 2002.

Michael Lustig et al., Sparse MRI: The Application of Compressed Sensing for Rapid MR Imaging, Magnetic Resonance in Medicine, 58:1182-1195, 2007.

John P. Mugler et al., Three-Dimensional Magnetization-Prepared Rapid Gradient-Echo Imaging (3D-MP RAGE), Magnetic Resonance in Medicine, 15:152-157, 1990.

* cited by examiner

SYSTEMS AND METHODS FOR MAGNETIC RESONANCE IMAGING

CROSS-REFERENCE TO RELATED APPLICATIONS

This application claims priority of Chinese Patent Application No. 201910398929.7 filed on May 14, 2019, the contents of which are incorporated herein by reference in their entirety.

TECHNICAL FIELD

The present disclosure generally relates to medical imaging field, and in particular, to systems and methods for magnetic resonance imaging.

BACKGROUND

Magnetic resonance imaging (MRI) is a widely used medical technique which can provide images associated with region of interest (ROI) containing important medical information. In general, signals may be saturated during an MRI scanning process and a signal recovery period (called "waiting period") is needed. However, the signal recovery period is relatively long, which may reduce an acquisition efficiency and/or an imaging efficiency. Therefore, it is desirable to provide MRI systems and methods for efficiently utilizing the waiting period, thereby improving imaging efficiency and image quality.

SUMMARY

An aspect of the present disclosure relates to a method for magnetic resonance imaging. The method may be implemented on a computing device including a processor and a storage. The method may include obtaining primary imaging data associated with a region of interest (ROI) of a subject and obtaining secondary data associated with the ROI. The method may also include determining secondary imaging data based on the secondary data by using a trained model. The method may further include reconstructing a magnetic resonance image based on the primary imaging data and the secondary imaging data.

In some embodiments, the primary imaging data may be acquired during an imaging period and the secondary data may be acquired during a waiting period.

In some embodiments, the method may further include monitoring a physiological motion of the subject and determining the imaging period and the waiting period based on an amplitude of the physiological motion of the subject.

In some embodiments, the determining the imaging period and the waiting period based on the amplitude of the physiological motion of the subject may include determining a period during which the amplitude of the physiological motion of the subject is less than or equal to a threshold as the imaging period and determining a period during which the amplitude of the physiological motion of the subject is larger than the threshold as the waiting period.

In some embodiments, the primary imaging data may be acquired based on a first sequence and the secondary data may be acquired based on a second sequence.

In some embodiments, the first sequence may include a fast spin echo (FSE) sequence and the second sequence may include a gradient echo sequence.

In some embodiments, the ROI may include a first sub-ROI and a second sub-ROI. The primary imaging data may be associated with the first sub-ROI. The secondary data may be associated with the second sub-ROI.

In some embodiments, the secondary imaging data may include a sensitivity distribution of an RF coil, tissue boundary information, and/or k-space high-frequency information.

In some embodiments, the trained model may include an artificial neural network model.

In some embodiments, the reconstructing the magnetic resonance image based on the primary imaging data and the secondary imaging data may include fusing the primary imaging data and the secondary imaging data and reconstructing the magnetic resonance image based on the fused data.

In some embodiments, the reconstructing the magnetic resonance image based on the primary imaging data and the secondary imaging data may include determining a first k-space based on the primary imaging data, determining a second k-space based on the secondary imaging data, determining a combined k-space based on the first k-space and the second k-space, and reconstructing the magnetic resonance image based on the combined k-space.

Another aspect of the present disclosure relates to a system for magnetic resonance imaging. The system may include at least one storage medium including a set of instructions and at least one processor in communication with the at least one storage medium. When executing the set of instructions, the at least one processor may be directed to cause the system to obtain primary imaging data associated with a region of interest (ROI) of a subject, obtain secondary data associated with the ROI, determine secondary imaging data based on the secondary data by using a trained model, and reconstruct a magnetic resonance image based on the primary imaging data and the secondary imaging data.

In some embodiments, the primary imaging data may be acquired during an imaging period and the secondary data may be acquired during a waiting period.

In some embodiments, the at least one processor may be directed to cause the system further to monitor a physiological motion of the subject and determine the imaging period and the waiting period based on an amplitude of the physiological motion of the subject.

In some embodiments, to determine the imaging period and the waiting period based on the amplitude of the physiological motion of the subject, the at least one processor may be directed to cause the system further to determine a period during which the amplitude of the physiological motion of the subject is less than or equal to a threshold as the imaging period, and determine a period during which the amplitude of the physiological motion of the subject is larger than the threshold as the waiting period.

In some embodiments, the primary imaging data may be acquired based on a first sequence and the secondary data may be acquired based on a second sequence.

In some embodiments, the ROI may include a first sub-ROI and a second sub-ROI. The primary imaging data may be associated with the first sub-ROI. The secondary data may be associated with the second sub-ROI.

In some embodiments, to reconstruct the magnetic resonance image based on the primary imaging data and the secondary imaging data, the at least one processor may be directed to cause the system further to fuse the primary imaging data and the secondary imaging data and reconstruct the magnetic resonance image based on the fused data.

In some embodiments, to reconstruct the magnetic resonance image based on the primary imaging data and the secondary imaging data, the at least one processor may be directed to cause the system further to determine a first k-space based on the primary imaging data, determine a second k-space based on the secondary imaging data, determine a combined k-space based on the first k-space and the second k-space, and reconstruct the magnetic resonance image based on the combined k-space.

A further aspect of the present disclosure relates to a non-transitory computer readable medium including executable instructions. When executed by at least one processor, the executable instructions may direct the at least one processor to perform a method. The method may include obtaining primary imaging data associated with a region of interest (ROI) of a subject and obtaining secondary data associated with the ROI. The method may also include determining secondary imaging data based on the secondary data by using a trained model. The method may further include reconstructing a magnetic resonance image based on the primary imaging data and the secondary imaging data.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures throughout the several views of the drawings, and wherein.

DETAILED DESCRIPTION

Figure 1:
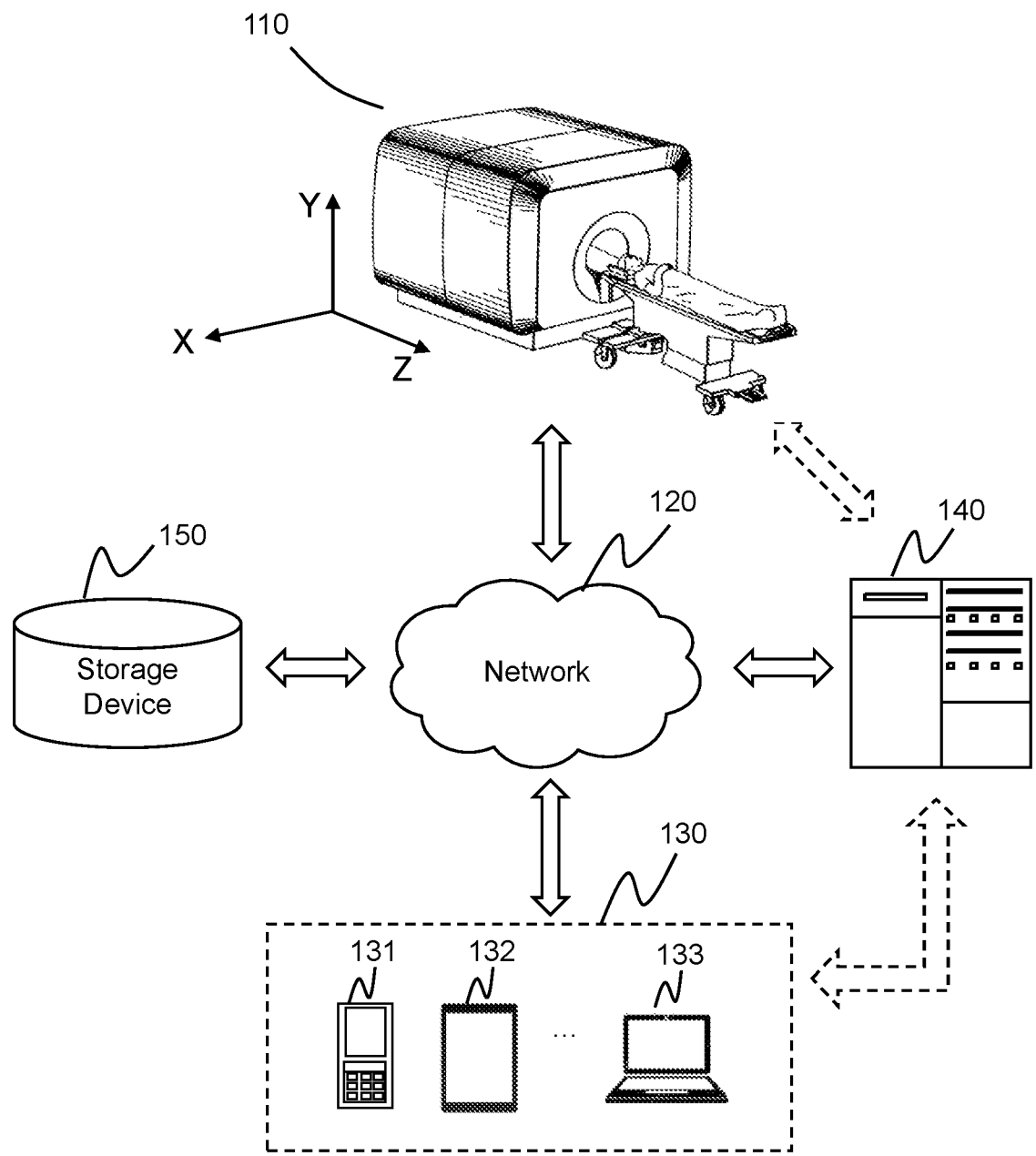
FIG. 1 is a schematic diagram illustrating an exemplary imaging system according to some embodiments of the present disclosure.

In the following detailed description, numerous specific details are set forth by way of examples in order to provide a thorough understanding of the relevant disclosure. However, it should be apparent to those skilled in the art that the present disclosure may be practiced without such details. In other instances, well-known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this disclosure, specify the presence of stated features, integers, steps, operations, elements, and/or components, but do not preclude the presence or addition of one or more other features, integers, steps, operations, elements, components, and/or groups thereof.

It will be understood that the terms "system," "engine," "unit," "module," and/or "block" used herein are one method to distinguish different components, elements, parts, sections, or assemblies of different levels in ascending order. However, the terms may be displaced by another expression if they achieve the same purpose.

Generally, the words "module," "unit," or "block" used herein refer to logic embodied in hardware or firmware, or to a collection of software instructions. A module, a unit, or a block described herein may be implemented as software and/or hardware and may be stored in any type of non-transitory computer-readable medium or another storage device. In some embodiments, a software module/unit/block may be compiled and linked into an executable program. It will be appreciated that software modules can be callable from other modules/units/blocks or from themselves, and/or may be invoked in response to detected events or interrupts. Software modules/units/blocks configured for performing on computing devices (e.g., processor 310 illustrated in FIG. 3) may be provided on a computer-readable medium, such as a compact disc, a digital video disc, a flash drive, a magnetic disc, or any other tangible medium, or as a digital download (and can be originally stored in a compressed or installable format that needs installation, decompression, or decryption prior to performing). Such software code may be stored, partially or fully, on a storage device of the performing computing device, for performing by the computing device. Software instructions may be embedded in firmware, such as an EPROM. It will be further appreciated that hardware modules/units/blocks may be included in connected logic components, such as gates and flip-flops, and/or can be included of programmable units, such as programmable gate arrays or processors. The modules/units/blocks or computing device functionality described herein may be implemented as software modules/units/blocks, but may be represented in hardware or firmware. In general, the modules/units/blocks described herein refer to logical modules/units/blocks that may be combined with other modules/units/blocks or divided into sub-modules/sub-units/sub-blocks despite their physical organization or storage. The description may be applicable to a system, an engine, or a portion thereof.

It will be understood that when a unit, engine, module, or block is referred to as being "on," "connected to," or "coupled to" another unit, engine, module, or block, it may be directly on, connected or coupled to, or communicate with the other unit, engine, module, or block, or an intervening unit, engine, module, or block may be present, unless the context clearly indicates otherwise. As used herein, the term "and/or" includes any and all combinations of one or more of the associated listed items.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

The flowcharts used in the present disclosure illustrate operations that systems implement according to some embodiments of the present disclosure. It is to be expressly understood, the operations of the flowcharts may be implemented not in order. Conversely, the operations may be implemented in inverted order, or simultaneously. Moreover, one or more other operations may be added to the flowcharts. One or more operations may be removed from the flowcharts.

Provided herein are systems and components for medical imaging and/or medical treatment. In some embodiments, the medical system may include an imaging system. The imaging system may include a single modality imaging system and/or a multi-modality imaging system. The single modality imaging system may include, for example, a magnetic resonance imaging (MRI) system. Exemplary MRI systems may include a superconducting magnetic resonance imaging system, a non-superconducting magnetic resonance imaging system, etc. The multi-modality imaging system may include, for example, a computed tomography-magnetic resonance imaging (MRI-CT) system, a positron emission tomography-magnetic resonance imaging (PET-MRI) system, a single photon emission computed tomography-magnetic resonance imaging (SPECT-MRI) system, a digital subtraction angiography-magnetic resonance imaging (DSA-MRI) system, etc. In some embodiments, the medical system may include a treatment system. The treatment system may include a treatment plan system (TPS), image-guide radiotherapy (IGRT), etc. The image-guide radiotherapy (IGRT) may include a treatment device and an imaging device. The treatment device may include a linear accelerator, a cyclotron, a synchrotron, etc., configured to perform a radio therapy on a subject. The treatment device may include an accelerator of species of particles including, for example, photons, electrons, protons, or heavy ions. The imaging device may include an MRI scanner, a CT scanner (e.g., cone beam computed tomography (CBCT) scanner), a digital radiology (DR) scanner, an electronic portal imaging device (EPID), etc.

An aspect of the present disclosure relates to systems and methods for magnetic resonance imaging. The systems may obtain primary imaging data and secondary data associated with a region of interest (ROI) of a subject. The systems may determine secondary imaging data based on the secondary data by using a trained model. The systems may further reconstruct a magnetic resonance (MR) image based on the primary imaging data and the secondary imaging data. According to the systems and methods of the present disclosure, the amount of the primary imaging data is reduced and/or the scanning time is shortened by introducing the secondary data, thereby improving the signal-to-noise ratio of the MR image and suppressing artifacts in the MR image.

FIG. 1 is a schematic diagram illustrating an exemplary imaging system according to some embodiments of the present disclosure. As illustrated, the imaging system 100 may include an MRI scanner 110, a network 120, a terminal device 130, a processing device 140, and a storage device 150. The components of the imaging system 100 may be connected in one or more of various ways. For example, as illustrated in FIG. 1, the MRI scanner 110 may be connected to the processing device 140 through the network 120. As another example, the MRI scanner 110 may be connected to the processing device 140 directly (as indicated by the bi-directional arrow in dotted lines linking the MRI scanner 110 and the processing device 140). As a further example, the storage device 150 may be connected to the processing device 140 directly or through the network 120. As a further example, the terminal device 130 may be connected to the processing device 140 directly (as indicated by the bi-directional arrow in dotted lines linking the terminal device 130 and the processing device 140) or through the network 120.

The MRI scanner 110 may scan an object located within its detection region and generate data relating to the object. In some embodiments, the object may include a patient, a man-made object, etc. In some embodiments, the object may include a specific portion, organ, and/or tissue of a patient. For example, the object may include a head, a brain, a neck, a body, a shoulder, an arm, a thorax, a cardiac, a stomach, a blood vessel, a soft tissue, a knee, feet, or the like, or any combination thereof. In some embodiments, the MRI scanner 110 may be a close-bore scanner or an open-bore scanner. In the present disclosure, the X axis, the Y axis, and the Z axis shown in FIG. 1 may form an orthogonal coordinate system. The X axis and the Z axis shown in FIG. 1 may be horizontal and the Y axis may be vertical. As illustrated, the positive X direction along the X axis may be from the right side to the left side of the MRI scanner 110 seen from the direction facing the front of the MRI scanner 110, the positive Y direction along the Y axis may be from the lower part to the upper part of the MRI scanner 110, the positive Z direction along the Z axis may refer to a direction in which the object is moved out of the scanning channel (or referred to as the bore) of the MRI scanner 110. More description of the MRI scanner 110 may be found elsewhere in the present disclosure (e.g., FIG. 2 and the description thereof). In the present disclosure, "subject" and "object" are used interchangeably.

The network 120 may include any suitable network that can facilitate the exchange of information and/or data for the imaging system 100. In some embodiments, one or more components (e.g., the MRI scanner 110, the terminal device 130, the processing device 140, the storage device 150) of the imaging system 100 may communicate with one or more other components of the imaging system 100 via the network 120. For example, the processing device 140 may obtain imaging data (e.g., primary imaging data, secondary data) from the MRI scanner 110, the storage device 150, and/or the terminal device 130 via the network 120. In some embodiments, the network 120 may be any type of wired or wireless network, or a combination thereof. The network 120 may be and/or include a public network (e.g., the Internet), a private network (e.g., a local area network (LAN), a wide area network (WAN))), a wired network (e.g., an Ethernet network), a wireless network (e.g., an 802.11 network, a Wi-Fi network), a cellular network (e.g., a Long Term Evolution (LTE) network), a frame relay network, a virtual private network ("VPN"), a satellite network, a telephone network, routers, hubs, switches, server computers, and/or any combination thereof. Merely by way of example, the network 120 may include a cable network, a wireline network, a fiber-optic network, a telecommunications network, an intranet, a wireless local area network (WLAN), a metropolitan area network (MAN), a public telephone switched network (PSTN), a Bluetooth™ network, a ZigBee™ network, a near field communication (NFC) network, or the like, or any combination thereof. In some embodiments, the network 120 may include one or more network access points. For example, the network 120 may include wired and/or wireless network access points such as base stations and/or internet exchange points through which one or more components of the imaging system 100 may be connected to the network 120 to exchange data and/or information.

The terminal device 130 may include a mobile device 131, a tablet computer 132, a laptop computer 133, or the like, or any combination thereof. In some embodiments, the mobile device 131 may include a smart home device, a wearable device, a smart mobile device, a virtual reality device, an augmented reality device, or the like, or any combination thereof. In some embodiments, the smart home device may include a smart lighting device, a control device of an intelligent electrical apparatus, a smart monitoring device, a smart television, a smart video camera, an interphone, or the like, or any combination thereof. In some embodiments, the wearable device may include a smart bracelet, smart footgear, a pair of smart glasses, a smart helmet, a smart watch, smart clothing, a smart backpack, a smart accessory, or the like, or any combination thereof. In some embodiments, the smart mobile device may include a smartphone, a personal digital assistant (PDA), a gaming device, a navigation device, a point of sale (POS) device, or the like, or any combination thereof. In some embodiments, the virtual reality device and/or the augmented reality device may include a virtual reality helmet, a virtual reality glass, a virtual reality patch, an augmented reality helmet, an augmented reality glass, an augmented reality patch, or the like, or any combination thereof. For example, the virtual reality device and/or the augmented reality device may include a Google™ Glass, an Oculus Rift, a Hololens, a Gear VR, etc. In some embodiments, the MRI scanner 110 and/or the processing device 140 may be remotely operated through the terminal device 130. In some embodiments, the MRI scanner 110 and/or the processing device 140 may be operated through the terminal device 130 via a wireless connection. In some embodiments, the terminal device 130 may receive information and/or instructions inputted by a user, and send the received information and/or instructions to the MRI scanner 110 or the processing device 140 via the network 120. In some embodiments, the terminal device 130 may receive data and/or information from the processing device 140. In some embodiments, the terminal device 130 may be part of the processing device 140. In some embodiments, the terminal device 130 may be omitted.

The processing device 140 may process data and/or information obtained from the MRI scanner 110, the terminal device 130, and/or the storage device 150. For example, the processing device 140 may obtain primary imaging data and/or secondary data from the MRI scanner 110, the storage device 150, and/or a terminal device 130. Also, the processing device 140 may determine secondary imaging data based on the secondary data. Further, the processing device 140 may reconstruct an MR image based on the primary imaging data and the secondary imaging data. In some embodiments, the processing device 140 may be a single server or a server group. The server group may be centralized or distributed. In some embodiments, the processing device 140 may be local or remote. For example, the processing device 140 may access information and/or data stored in or acquired by the MRI scanner 110, the terminal device 130, and/or the storage device 150 via the network 120. As another example, the processing device 140 may be directly connected to the MRI scanner 110 (as illustrated by the bidirectional arrow in dashed lines connecting the processing device 140 and the MRI scanner 110 in FIG. 1), the terminal device 130 (as illustrated by the bidirectional arrow in dashed lines connecting the processing device 140 and the terminal device 130 in FIG. 1), and/or the storage device 150 to access stored or acquired information and/or data. In some embodiments, the processing device 140 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof. In some embodiments, the processing device 140 may be implemented on a computing device 300 having one or more components illustrated in FIG. 3 in the present disclosure.

The storage device 150 may store data and/or instructions. In some embodiments, the storage device 150 may store data obtained from the MRI scanner 110, the terminal device 130, and/or the processing device 140. For example, the storage device 150 may store historical secondary data and historical secondary imaging data, which may be used to train a model. As another example, the storage device 150 may store primary imaging data and/or secondary data acquired by the MRI scanner 110. In some embodiments, the storage device 150 may store data and/or instructions that the processing device 140 may execute or use to perform exemplary methods described in the present disclosure. For example, the storage device 150 may store instructions that the processing device 140 may execute to reconstruct a magnetic resonance image. In some embodiments, the storage device 150 may include a mass storage device, a removable storage device, a volatile read-and-write memory, a read-only memory (ROM), or the like, or any combination thereof. Exemplary mass storage may include a magnetic disk, an optical disk, a solid-state drive, etc. Exemplary removable storage may include a flash drive, a floppy disk, an optical disk, a memory card, a zip disk, a magnetic tape, etc. Exemplary volatile read-and-write memory may include a random access memory (RAM). Exemplary RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. Exemplary ROM may include a mask ROM (MROM), a programmable ROM (PROM), an erasable programmable ROM (EPROM), an electrically erasable programmable ROM (EEPROM), a compact disk ROM (CD-ROM), and a digital versatile disk ROM, etc. In some embodiments, the storage device 150 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

In some embodiments, the storage device 150 may be connected to the network 120 to communicate with one or more components (e.g., the MRI scanner 110, the processing device 140, the terminal device 130) of the imaging system 100. One or more components of the imaging system 100 may access the data or instructions stored in the storage device 150 via the network 120. In some embodiments, the storage device 150 may be directly connected to or communicate with one or more components (e.g., the MRI scanner 110, the processing device 140, the terminal device 130) of the Imaging system 100. In some embodiments, the storage device 150 may be part of the processing device 140.

In some embodiments, the imaging system 100 may further include one or more power supplies (not shown in FIG. 1) connected to one or more components (e.g., the MRI scanner 110, the processing device 140, the terminal device 130, the storage device 150) of the imaging system 100.

It should be noted that the above description is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure.

Figure 2:
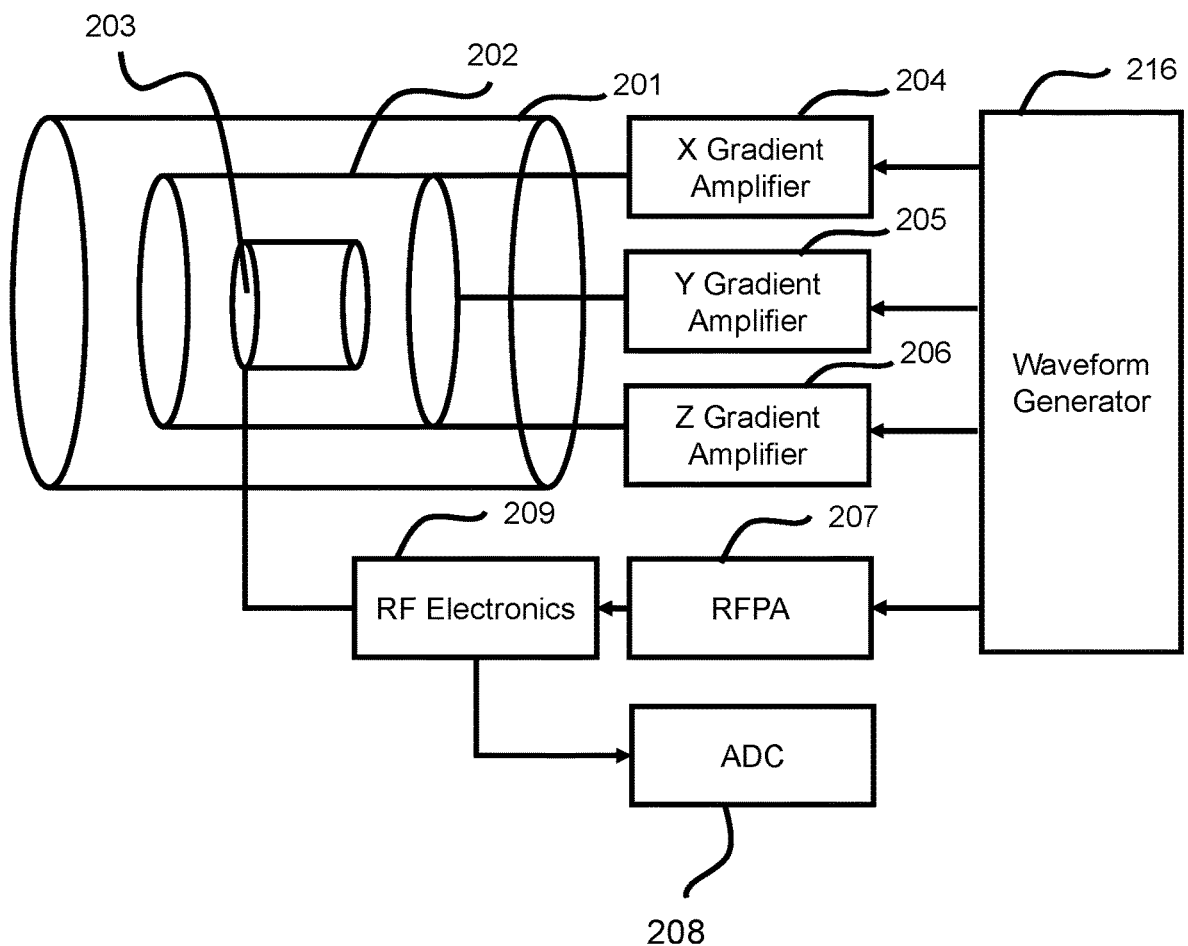
FIG. 2 is a schematic diagram illustrating an exemplary MRI scanner according to some embodiments of the present disclosure.

FIG. 2 is a schematic diagram illustrating an exemplary MRI scanner according to some embodiments of the present disclosure. As illustrated, a main magnet 201 may generate a first magnetic field (also referred to as a "main magnetic field") that may be applied to an object exposed inside the field. The main magnet 201 may include a resistive magnet or a superconductive magnet that both need a power supply (not shown) for operation. Alternatively, the main magnet 201 may include a permanent magnet. The main magnet 201 may include a bore that the object is placed within. The main magnet 201 may also control the homogeneity of the generated main magnetic field. Some shim coils may be in the main magnet 201. The shim coils placed in the gap of the main magnet 201 may compensate for the inhomogeneity of the magnetic field of the main magnet 201. The shim coils may be energized by a shim power supply.

Gradient coils 202 may be located inside the main magnet 201. The gradient coils 202 may generate a second magnetic field (also referred to as a "gradient field", including gradient fields Gx, Gy, and Gz). The second magnetic field may be superimposed on the main field generated by the main magnet 201 and distort the main field so that the magnetic orientations of the protons of an object may vary as a function of their positions inside the gradient field, thereby encoding spatial information into MR signals related to the region of the object being imaged. The gradient coils 202 may include X coils (e.g., configured to generate the gradient field Gx corresponding to the X direction), Y coils (e.g., configured to generate the gradient field Gy corresponding to the Y direction), and/or Z coils (e.g., configured to generate the gradient field Gz corresponding to the Z direction) (not shown in FIG. 2). In some embodiments, the Z coils may be designed based on circular (Maxwell) coils, while the X coils and the Y coils may be designed on the basis of the saddle (Golay) coil configuration. The three sets of coils may generate three different magnetic fields that are used for position encoding. The gradient coils 202 may allow spatial encoding of MR signals for image construction. The gradient coils 202 may be connected with one or more of an X gradient amplifier 204, a Y gradient amplifier 205, or a Z gradient amplifier 206. One or more of the three amplifiers may be connected to a waveform generator 216. The waveform generator 216 may generate gradient waveforms that are applied to the X gradient amplifier 204, the Y gradient amplifier 205, and/or the Z gradient amplifier 206. An amplifier may amplify a waveform. An amplified waveform may be applied to one of the coils in the gradient coils 202 to generate a magnetic field in the X-axis, the Y-axis, or the Z-axis, respectively. The gradient coils 202 may be designed for either a close-bore MRI scanner or an open-bore MRI scanner. In some instances, all three sets of coils of the gradient coils 202 may be energized and three gradient fields may be generated thereby. In some embodiments of the present disclosure, the X coils and Y coils may be energized to generate the gradient fields in the X direction and the Y direction. As used herein, the X-axis, the Y-axis, the Z-axis, the X direction, the Y direction, and the Z direction in the description of FIG. 2 are the same as or similar to those described in FIG. 1.

In some embodiments, radio frequency (RF) coils 203 may be located inside the main magnet 201 and serve as transmitters, receivers, or both. The RF coils 203 may be in connection with RF electronics 209 that may be configured or used as one or more integrated circuits (ICs) functioning as a waveform transmitter and/or a waveform receiver. The RF electronics 209 may be connected to a radiofrequency power amplifier (RFPA) 207 and an analog-to-digital converter (ADC) 208.

When used as transmitters, the RF coils 203 may generate RF signals that provide a third magnetic field that is utilized to generate MR signals related to the region of the object being imaged. The third magnetic field may be perpendicular to the main magnetic field. The waveform generator 216 may generate an RF pulse. The RF pulse may be amplified by the RFPA 207, processed by the RF electronics 209, and applied to the RF coils 203 to generate the RF signals in response to a powerful current generated by the RF electronics 209 based on the amplified RF pulse.

When used as receivers, the RF coils may be responsible for detecting MR signals (e.g., echoes). After excitation, the MR signals generated by the object may be sensed by the RF coils 203. The receive amplifier then may receive the sensed MR signals from the RF coils 203, amplify the sensed MR signals, and provide the amplified MR signals to the ADC 208. The ADC 208 may transform the MR signals from analog signals to digital signals. The digital MR signals then may be sent to the processing device 140 for sampling.

In some embodiments, the gradient coils 202 and the RF coils 203 may be circumferentially positioned with respect to the object. It is understood by those skilled in the art that the main magnet 201, the gradient coils 202, and the RF coils 203 may be situated in a variety of configurations around the object.

In some embodiments, the RFPA 207 may amplify an RF pulse (e.g., the power of the RF pulse, the voltage of the RF pulse) such that an amplified RF pulse is generated to drive the RF coils 203. The RFPA 207 may include a transistor-based RFPA, a vacuum tube-based RFPA, or the like, or any combination thereof. The transistor-based RFPA may include one or more transistors. The vacuum tube-based RFPA may include a triode, a tetrode, a klystron, or the like, or any combination thereof. In some embodiments, the RFPA 207 may include a linear RFPA, or a nonlinear RFPA. In some embodiments, the RFPA 207 may include one or more RFPAs.

In some embodiments, the MRI scanner 110 may further include an object positioning system (not shown). The object positioning system may include an object cradle and a transport device. The object may be placed on the object cradle and be positioned by the transport device within the bore of the main magnet 201.

MRI systems (e.g., the imaging system 100 in the present disclosure) may be commonly used to obtain an interior image from a patient for a particular region of interest that can be used for the purposes of, for example, diagnosis, treatment, or the like, or a combination thereof. The MRI systems may include a main magnet (e.g., the main magnet 201) assembly for providing a strong uniform main magnetic field to align the individual magnetic moments of the H atoms within the patient's body. During this process, the H atoms may oscillate around their magnetic poles at their characteristic Larmor frequency. If the tissue is subjected to an additional magnetic field, which is tuned to the Larmor frequency, the H atoms may absorb additional energy, which rotates the net aligned moment of the H atoms. The additional magnetic field may be provided by an RF excitation signal (e.g., the RF signal generated by the RF coils 203). When the additional magnetic field is removed, the magnetic moments of the H atoms may rotate back into alignment with the main magnetic field thereby emitting an MR signal. The MR signal may be received and processed to form an MR image. T1 relaxation may be the process by which the net magnetization grows/returns to its initial maximum value parallel to the main magnetic field. T1 may be the time constant for regrowth of longitudinal magnetization (e.g., along the main magnetic field). T2 relaxation may be the process by which the transverse components of magnetization decay or dephase. T2 may be the time constant for decay/dephasing of transverse magnetization.

If the main magnetic field is uniform across the entire body of the patient, then the RF excitation signal may excite all of the H atoms in the sample non-selectively. Accordingly, in order to image a particular portion of the patient's body, magnetic field gradients Gx, Gy, and Gz (e.g., generated by the gradient coils 202) in the x, y, and z directions, having a particular timing, frequency, and phase, may be superimposed on the uniform magnetic field such that the RF excitation signal may excite the H atoms in a desired slice of the patient's body, and unique phase and frequency information may be encoded in the MR signal depending on the location of the H atoms in the "image slice."

Typically, portions of the patient's body to be imaged are scanned by a sequence of measurement cycles in which the RF excitation signals and the magnetic field gradients Gx, Gy, and Gz vary according to an MRI imaging protocol that is being used. A protocol may be designed for one or more tissues to be imaged, diseases, and/or clinical scenarios. A protocol may include a certain number of pulse sequences oriented in different planes and/or with different parameters. The pulse sequences may include spin echo sequences, gradient echo sequences, diffusion sequences, inversion recovery sequences, or the like, or any combination thereof. For instance, the spin echo sequences may include a fast spin echo (FSE), a turbo spin echo (TSE), a rapid acquisition with relaxation enhancement (RARE), a half-Fourier acquisition single-shot turbo spin-echo (HASTE), a turbo gradient spin echo (TGSE), or the like, or any combination thereof. The protocol may also include information regarding image contrast and/or ratio, an ROI, slice thickness, an imaging type (e.g., T1 weighted imaging, T2 weighted imaging, proton density weighted imaging), T1, T2, an echo type (spin echo, fast spin echo (FSE), fast recovery FSE, single shot FSE, gradient recalled echo, fast imaging with steady-state procession, and so on), a flip angle value, acquisition time (TA), echo time (TE), repetition time (TR), an echo train length (ETL), the number of phases, the number of excitations (NEX), inversion time, bandwidth (e.g., RF receiver bandwidth, RF transmitter bandwidth), or the like, or any combination thereof.

For each MRI scan, the resulting MR signals may be digitized and processed (e.g., by Fourier transform (FT) of data in a k-space, frequency encoding, phase encoding) to reconstruct an image in accordance with the MRI imaging protocol that is used.

Figure 3:
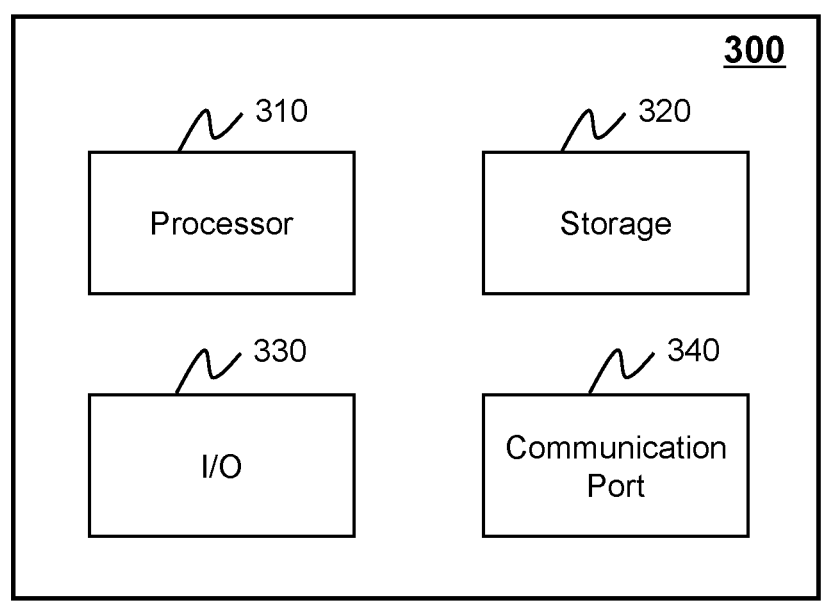
FIG. 3 is a schematic diagram illustrating exemplary hardware and/or software components of an exemplary computing device according to some embodiments of the present disclosure.

FIG. 3 is a schematic diagram illustrating exemplary hardware and/or software components of an exemplary computing device according to some embodiments of the present disclosure. In some embodiments, the processing device 140 may be implemented on the computing device 130. As illustrated in FIG. 3, the computing device 300 may include a processor 310, a storage 320, an input/output (I/O) 330, and a communication port 340.

The processor 310 may execute computer instructions (program code) and perform functions of the processing device 140 in accordance with techniques described herein. The computer instructions may include routines, programs, objects, components, signals, data structures, procedures, modules, and functions, which perform particular functions described herein. For example, the processor 310 may obtain primary imaging data and/or secondary data associated with a region of interest (ROI) of a subject and reconstruct an MR image based on the primary imaging data and/or the secondary data. In some embodiments, the processor 310 may include a microcontroller, a microprocessor, a reduced instruction set computer (RISC), an application specific integrated circuits (ASICs), an application-specific instruction-set processor (ASIP), a central processing unit (CPU), a graphics processing unit (GPU), a physics processing unit (PPU), a microcontroller unit, a digital signal processor (DSP), a field programmable gate array (FPGA), an advanced RISC machine (ARM), a programmable logic device (PLD), any circuit or processor capable of executing one or more functions, or the like, or any combinations thereof.

Merely for illustration purposes, only one processor is described in the computing device 300. However, it should be noted that the computing device 300 in the present disclosure may also include multiple processors, and thus operations of a method that are performed by one processor as described in the present disclosure may also be jointly or separately performed by the multiple processors. For example, if in the present disclosure the processor of the computing device 300 executes both operations A and B, it should be understood that operations A and step B may also be performed by two different processors jointly or separately in the computing device 300 (e.g., a first processor executes operation A and a second processor executes operation B, or the first and second processors jointly execute operations A and B).

Merely by way example, the processor 310 may receive instructions to follow an MRI scan protocol for imaging/scanning the object. For example, the processor 310 may instruct the object positioning system of the MRI scanner 110 to move the object to a proper position within the bore of the main magnet 201. As another example, the processor 310 may also provide certain control signals to control the main magnet 201 to generate a main magnet field with a specific strength.

The processor 310 may receive control signals to set the shape, amplitude, and/or timing of the gradient waveforms and/or the RF waveforms, and send the set parameters to the waveform generator 216 to instruct the waveform generator 216 to generate a particular gradient waveform sequence and pulse sequence that are to be applied to the gradient coils 202 and the RF coils 203 through the amplifiers 204-207, respectively.

The processor 310 may also sample data (e.g., echoes) from the RF coils 203 based on one or more sampling parameters including, for example, timing information (e.g., the length of data acquisition), the type of k-space data acquisition (e.g., undersampling, oversampling), sampling trajectory (e.g., Cartesian trajectory, non-Cartesian trajectory such as spiral trajectory, radial trajectory), or the like, or a combination thereof. In some embodiments, the timing information may be input by a user (e.g., an operator) or autonomously determined by the MRI system 100 based on one or more other parameters (e.g., clinical needs) of an imaging process. The timing information may correspond to the type of the gradient and RF waveforms that are sent to the gradient coils 202 and the RF coils 203, respectively, so that the MR signals may be correctly sampled. The processor 310 may also generate an MR image by reconstructing the sampled data.

The storage 320 may store data/information obtained from the MRI scanner 110, the terminal device 130, the storage device 150, or any other component of the Imaging system 100. In some embodiments, the storage 320 may include a mass storage device, a removable storage device, a volatile read-and-write memory, a read-only memory (ROM), or the like, or any combination thereof. For example, the mass storage device may include a magnetic disk, an optical disk, a solid-state drive, etc. The removable storage device may include a flash drive, a floppy disk, an optical disk, a memory card, a zip disk, a magnetic tape, etc. The volatile read-and-write memory may include a random access memory (RAM). The RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. The ROM may include a mask ROM (MROM), a programmable ROM (PROM), an erasable programmable ROM (PEROM), an electrically erasable programmable ROM (EEPROM), a compact disk ROM (CD-ROM), and a digital versatile disk ROM, etc. In some embodiments, the storage 320 may store one or more programs and/or instructions to perform exemplary methods described in the present disclosure. For example, the storage 320 may store a program for the processing device 140 for determining secondary imaging data based on secondary data and reconstructing an MR image based on primary imaging data and the secondary imaging data.

The I/O 330 may input or output signals, data, or information. In some embodiments, the I/O 330 may enable user interaction with the processing device 140. In some embodiments, the I/O 330 may include an input device and an output device. Exemplary input devices may include a keyboard, a mouse, a touch screen, a microphone, a trackball, or the like, or a combination thereof. Exemplary output devices may include a display device, a loudspeaker, a printer, a projector, or the like, or a combination thereof. Exemplary display devices may include a liquid crystal display (LCD), a light-emitting diode (LED)-based display, a flat panel display, a curved screen, a television device, a cathode ray tube (CRT), or the like, or a combination thereof.

Merely by way of example, a user (e.g., an operator) may input data related to an object (e.g., a patient) that is being/to be imaged/scanned through the I/O 330. The data related to the object may include identification information (e.g., a name, an age, a gender, a medical history, contract information, a physical examination result) and/or the test information including the nature of the MRI scan that must be performed. The user may also input parameters needed for the operation of the MRI scanner 110, such as image contrast and/or ratio, a region of interest (ROI), slice thickness, an imaging type (e.g., T1 weighted imaging, T2 weighted imaging, proton density weighted imaging), T1, T2, an echo type (spin echo, fast spin echo (FSE), fast recovery FSE, single shot FSE, gradient recalled echo, fast imaging with steady-state procession), a flip angle value, acquisition time (TA), echo time (TE), repetition time (TR), echo train length (ETL), the number of phases, the number of excitations (NEX), inversion time, bandwidth (e.g., RF receiver bandwidth, RF transmitter bandwidth), a scan type, a type of sampling, or the like, or any combination thereof. The I/O may also display MR images generated based on the sampled data.

The communication port 340 may be connected to a network (e.g., the network 120) to facilitate data communications. The communication port 340 may establish connections between the processing device 140 and the MRI scanner 110, the terminal device 130, or the storage device 150. The connection may be a wired connection, a wireless connection, or a combination of both that enables data transmission and reception. The wired connection may include an electrical cable, an optical cable, a telephone wire, or the like, or any combination thereof. The wireless connection may include Bluetooth, Wi-Fi, WiMax, WLAN, ZigBee, mobile network (e.g., 3G, 4G, 5G), or the like, or a combination thereof. In some embodiments, the communication port 340 may be a standardized communication port, such as RS232, RS485, etc. In some embodiments, the communication port 340 may be a specially designed communication port. For example, the communication port 340 may be designed in accordance with the digital imaging and communications in medicine (DICOM) protocol.

Figure 4:
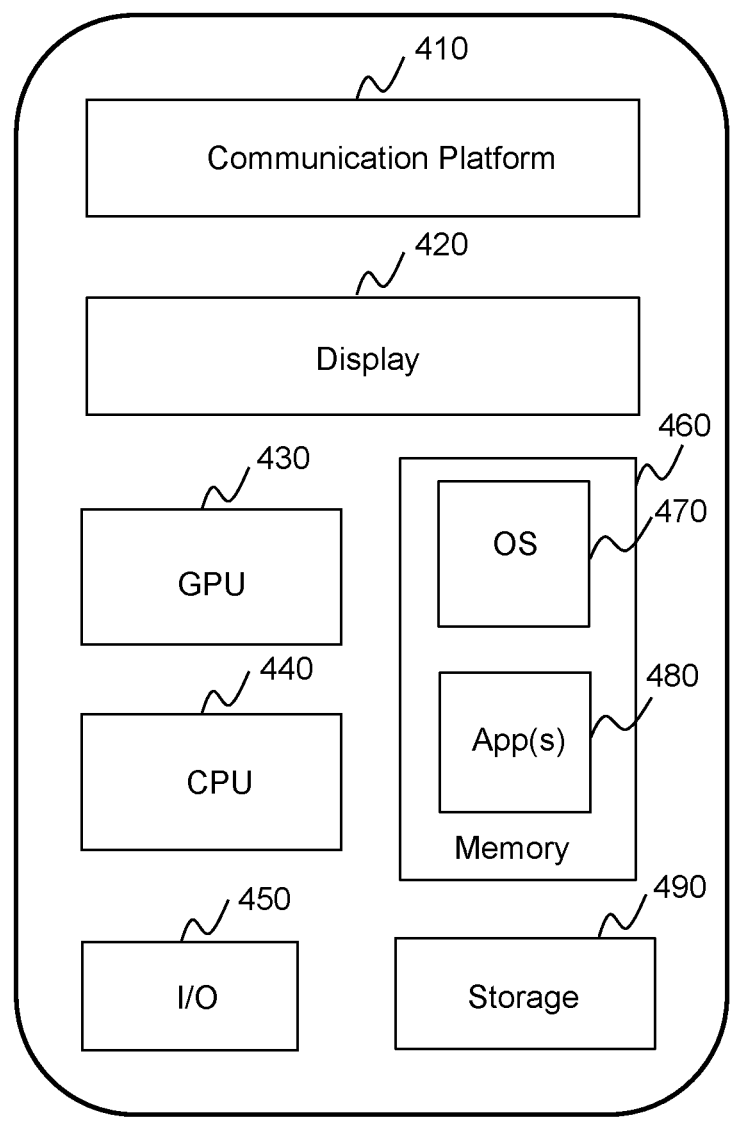
FIG. 4 is a schematic diagram illustrating exemplary hardware and/or software components of an exemplary mobile device according to some embodiments of the present disclosure.

FIG. 4 is a schematic diagram illustrating exemplary hardware and/or software components of an exemplary mobile device according to some embodiments of the present disclosure. In some embodiments, the terminal device 130 may be implemented on the mobile device 400. As illustrated in FIG. 4, the mobile device 400 may include a communication platform 410, a display 420, a graphic processing unit (GPU) 430, a central processing unit (CPU) 440, an I/O 450, a memory 460, and a storage 490. In some embodiments, any other suitable component, including but not limited to a system bus or a controller (not shown), may also be included in the mobile device 400.

In some embodiments, a mobile operating system 470 (e.g., iOS, Android, Windows Phone) and one or more applications 480 may be loaded into the memory 460 from the storage 490 in order to be executed by the CPU 440. The applications 480 may include a browser or any other suitable mobile apps for receiving and rendering information relating to image processing or other information from the processing device 140. User interactions with the information stream may be achieved via the I/O 450 and provided to the processing device 140 and/or other components of the Imaging system 100 via the network 120.

To implement various modules, units, and their functionalities described in the present disclosure, computer hardware platforms may be used as the hardware platform(s) for one or more of the elements described herein. The hardware elements, operating systems and programming languages of such computers are conventional in nature, and it is presumed that those skilled in the art are adequately familiar therewith to adapt those technologies to the blood pressure monitoring as described herein. A computer with user interface elements may be used to implement a personal computer (PC) or another type of work station or terminal device, although a computer may also act as a server if appropriately programmed. It is believed that those skilled in the art are familiar with the structure, programming and general operation of such computer equipment and as a result the drawings should be self-explanatory.

Figure 5:
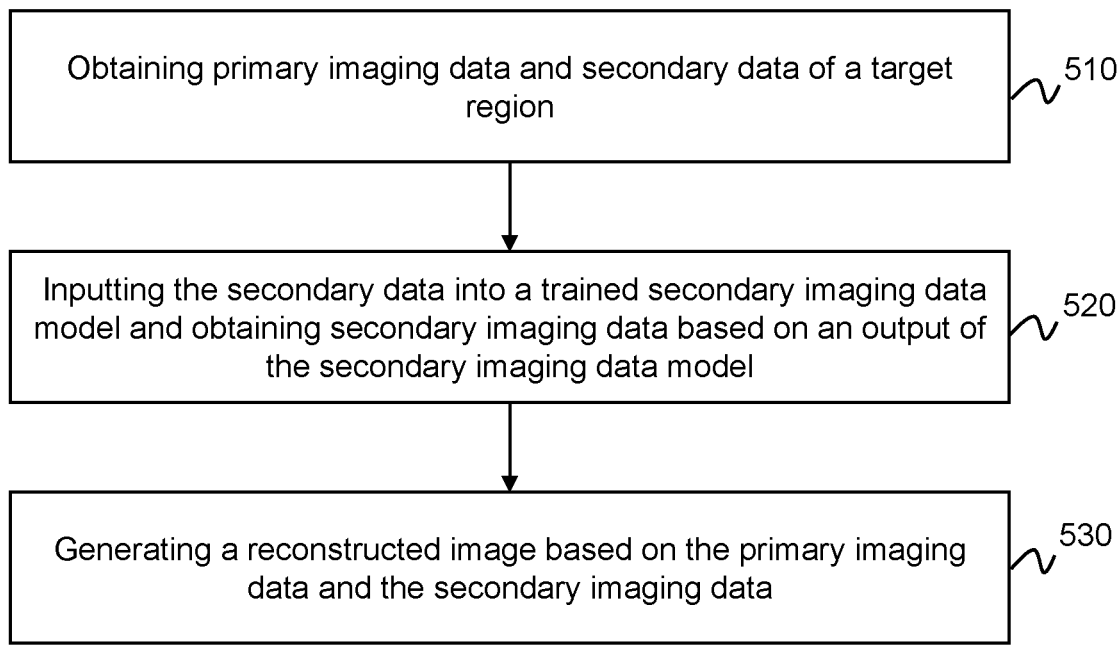
FIG. 5 is a flowchart illustrating an exemplary process for reconstructing a magnetic resonance image according to some embodiments of the present disclosure.

FIG. 5 is a flowchart illustrating an exemplary process for reconstructing an MR image according to some embodiments of the present disclosure. In some embodiments, at least part of process 500 may be performed by the processing device 140 (implemented in, for example, the computing device 300 shown in FIG. 3). For example, the process 500 may be stored in a storage device (e.g., the storage device 150, the storage 320, the storage 490) in the form of instructions (e.g., an application), and invoked and/or executed by the processing device 140 (e.g., the processor 310 illustrated in FIG. 3, the CPU 440 illustrated in FIG. 4, one or more modules illustrated in FIG. 11). The operations of the illustrated process presented below are intended to be illustrative. In some embodiments, the process 500 may be accomplished with one or more additional operations not described, and/or without one or more of the operations discussed. Additionally, the order in which the operations of the process 500 as illustrated in FIG. 5 and described below is not intended to be limiting.

In 510, primary imaging data and secondary data of a target region (also referred to as "region of interest (ROI)") may be obtained. The primary imaging data and the secondary data may be obtained by the processing device 140 or an MR image reconstruction device 1100 (e.g., a raw data obtaining module 1110) illustrated in FIG. 11.

In some embodiments, the target region may be a region to be scanned of a subject. As described in connection with FIG. 1, the subject may be biological or non-biological. For example, the subject may include a living animal body, a human body (e.g., a patient), a man-made subject, or the like, or a combination thereof. The target region may include a specific portion, organ, and/or tissue of the subject. For example, the target region may include a head, a neck, a breast, a limb, an abdomen, a heart, a liver, a pelvis, or the like, or any combination thereof.

In some embodiments, the target region in detection may be affected by a physiological motion of the subject. The physiological motion may include a respiration motion, a cardiac motion, a blood vessel fluctuation, a gastrointestinal motility, or the like, or any combination thereof. In some embodiments, the target region may move due to the physiological motion of the subject. For example, due to the cardiac motion, a target region on the heart or an organ (e.g., a left lung) near the heart may move with the beat of the heart. As another example, due to the respiration motion, a target region on a lung may move to different positions at different phases of a respiratory state (e.g., an exhalation state, an inhalation state, a late respiration phase).

In some embodiments, the primary imaging data of the target region may be necessary data for generating a reconstructed image of the target region and the secondary data of the target region may be unnecessary data for generating the reconstructed image of the target region. For example, the reconstructed image of the target region cannot be generated without the primary imaging data; whereas, the reconstructed image may still be obtained through some specific methods without the secondary data.

In some embodiments, the primary imaging data and/or the secondary data may correspond to various types. For example, the primary imaging data may be obtained when the target region is in a preset state (e.g., a state in which an amplitude of the physiological motion of the subject is less than or equal to a preset threshold) and the secondary data may be obtained when the target region is in a non-preset state (e.g.; a state in which an amplitude of the physiological motion of the subject is larger than the preset threshold.) Accordingly, the primary imaging data may be less affected by the physiological motion than the secondary data. As another example, the primary imaging data may include MR signals obtained when the target region is excited and the secondary data may include a motion state curve (which may be acquired by a motion detection device or may be obtained from an external resource) of the subject. As a further example, the primary imaging data may include data associated with a specific region of interest (ROI) (e.g., lesions; voxels) of the target region and the secondary data may include reference data (e.g., contour information, topogram image information) associated with the target region. As still a further example, the primary imaging data may include data associated with a sub-region (e.g., a sub-region with a physiological motion amplitude larger than a threshold) of the target region and the secondary data may include data associated with another sub-region (e.g., a sub-region with a physiological motion amplitude less than the threshold) of the target region. As still a further example, the primary imaging data may be collected (or acquired) based on a k-space under-sampling technique and the secondary data may correspond to a portion of the k-space where no data is collected.

In some embodiments, a magnetic resonance scanning process may include an imaging period and a waiting period. In order to fully utilize the magnetic resonance scanning process, scanning data may be collected in both the imaging period and the waiting period, and an image of the target region may be reconstructed based on the scanning data collected during the imaging period and the waiting period. More descriptions regarding the imaging period and the waiting period may be found elsewhere in the present disclosure (e.g., FIG. 7 and the descriptions thereof). In some embodiments, the primary imaging data may include scanning data collected during the imaging period and the secondary data may include scanning data collected during the imaging period and/or the waiting period. In some embodiments, a collection time of the secondary data may be determined based on a data type of the secondary data. For example, if the secondary data includes a motion state curve of the subject, the collection time of the secondary data may cover the whole scanning process.

In some embodiments, the primary imaging data may be obtained by applying a first sequence (also referred to as "first MRI pulse sequence" which may be an imaging sequence) during the imaging period and the secondary data may be obtained by applying a second sequence (also referred to as "second MRI pulse sequence" which may an imaging sequence or not (e.g., a navigator echo sequence)) during the waiting period. The first sequence may include a free induction decay (FID) sequence, a spin echo (SE) sequence, a gradient recalled echo (GRE) sequence, a hybrid sequence, or the like, or any combination thereof. The second sequence may include a navigator echo sequence, a scout scan sequence, a fast scout scan sequence, or the like, or any combination thereof. In some embodiments, the secondary data may be obtained by using an external device instead of applying a sequence. For example, the external device may include an electrocardiogram (ECG) electrode configured to obtain a cardiac motion curve of the subject. As another example, the external device may include a pulse detecting clip or a finger sleeve configured to obtain a cardiac motion curve of the subject. As a further example, the external device may include a pressure detecting sensor such as an elastic breathing band and/or a respiratory pressure pad configured to obtain a respiration motion curve of the subject.

Alternatively or additionally, the primary imaging data may be obtained by applying the first sequence during the imaging period and the secondary data may be obtained by applying the second sequence continuously during the whole scanning process, wherein the first sequence may be determined according to a scanning and/or an imaging requirement and the second sequence may be determined according to a data type of the secondary data. For example, it is assumed that a T2 weighted FSE image of the target region is intended to be obtained, the first sequence may be determined as an FSE sequence and the second sequence may be determined as a gradient echo sequence which may be used as a navigator sequence. As used herein, T2 may be a time constant for decay/dephasing of transverse magnetization. Specifically, the FSE sequence may be applied in the imaging period and MR signals released by the target region after the FSE sequence is applied may be collected as the primary imaging data of the target region; navigation signals after the gradient echo sequence is applied may be collected as the secondary data of the target region.

For example, the secondary data may be a cardiac motion curve, which may be divided into a systolic phase (which corresponds to a periodic phase from an R wave to a T wave) and a diastolic phase (which corresponds to a periodic phase from an end of the T wave to a center of the P wave). In this situation, the primary imaging data may be MR signals corresponding to a mid-to-late section of the diastolic phase in the cardiac motion curve. As another example, the secondary data may be a respiration motion curve, which may be divided into an inhalation phase, an exhalation phase, and a late respiration phase. In this situation, the primary imaging data may be MR signals corresponding to the late respiration phase, which may be minimally affected by the respiration motion.

In some embodiments, the target region may include a first region (also referred to as "first sub-ROI") with a physiological motion amplitude larger than a threshold and a second region (also referred to as "second sub-ROI") with a physiological motion amplitude less than the threshold. Accordingly, the primary imaging data may include data associated with the first region and the secondary data may include data associated with the second region. The threshold may be a default setting of the imaging system 100 or may be adjustable under different situations.

For example, if the target region is a region including a blood vessel, the first region and the second region may be determined based on a blood flow signal, for example, the blood vessel may be determined as the first region and a region other than the blood vessel where a physiological motion amplitude is less than the threshold may be determined as the second region. Further, a sequence suitable for collecting dynamic signals may be applied during the imaging period and magnetic resonance data of the first region may be determined as the primary imaging data. Moreover, a sequence suitable for collecting static signals may be applied during the waiting period and magnetic resonance data of the second region may be determined as the secondary data. In this situation, the data of the first region and the data of the second region may be obtained by applying different sequences suitable for different features of corresponding regions. As a result, the obtained data may be relatively accurate and an image quality of an image reconstructed based on the obtained data may be relatively high.

In 520, the secondary data may be input into a trained secondary imaging data model (also referred to as "trained model" for brevity) and secondary imaging data may be obtained based on an output of the secondary imaging data model. The trained secondary imaging data model may be obtained from a training module of the MR image reconstruction device 1100 illustrated in FIG. 11 or a storage device (e.g., the storage device 150) disclosed elsewhere in the present disclosure. The secondary imaging data may be obtained by the processing device 140 or the MR image reconstruction device 1100 (e.g., a secondary imaging data module 1120) illustrated in FIG. 11.

In some embodiments, the secondary imaging data model may be established based on a neural network. As used herein, the neural network may be a module built on an artificial neural network (ANN) that consists of a large number of nodes (or neurons) connected to each other, wherein each node represents a specific output function called an activation function and a connection between any two nodes represents a weighting value (referred to as "weight") of a signal passing through the connection. The neural network may include a data input layer, an intermediate hidden layer, and a data output layer. In some embodiments, the neural network may include a convolution neural network (CNN), a generative adversarial network (GAN), etc.

In some embodiments, a type of the secondary imaging data model may be determined based on a data type of the secondary imaging data. The data type of the secondary imaging data may include a receiving sensitivity distribution of the RF coils 203, tissue boundary information, a k-space high frequency component, or the like, or any combination thereof. As used herein, the k-space high-frequency component may correspond to an edge component of the k-space, which may relate to a sharpness of an image reconstructed based on the k-space. Accordingly, the type of the secondary imaging data model may include a sensitivity distribution model, a tissue boundary model, a k-space high-frequency model, or the like, or any combination thereof. For example, if the secondary imaging data is the receiving sensitivity distribution of the RF coils 203, the secondary imaging data may be obtained based on the secondary data by using a trained sensitivity distribution model. As another example, if the secondary imaging data is the tissue boundary information, the secondary imaging data may be obtained based on the secondary data by using a trained tissue boundary model. As a further example, if the secondary imaging data is the k-space high-frequency component, the secondary imaging data may be obtained based on the secondary data by using a trained k-space high-frequency model.

In some embodiments, the secondary imaging data model may be trained based on a training process. For example, sample secondary data and sample secondary imaging data (which may be set as labels) corresponding to the sample secondary data may be obtained and a first training sample set may be determined based on the sample secondary data and the sample secondary imaging data.

Further, a pre-established secondary imaging data model (e.g., a preliminary secondary imaging data model) may be trained based on the first training sample set. Finally, a trained secondary imaging data model may be obtained. For example, the first training sample set may be input into the pre-established secondary imaging data model. When a certain condition is satisfied (e.g., a count of iterations is larger than a threshold, a value of a loss function is less than a threshold), a secondary imaging data model corresponding to a current iteration may be designated as the trained secondary imaging data model.

In some embodiments, historical secondary data and historical secondary imaging data in historical magnetic resonance scanning may be obtained and designated as the sample secondary data and the sample secondary imaging data respectively. Further, a plurality of sample pairs (each of which includes sample secondary data and corresponding sample secondary imaging data) may be determined and the first training sample set may be determined based on the plurality of sample pairs. Then the pre-established secondary imaging data model may be trained based on the first training sample set and a trained secondary imaging data model may be obtained.

In some embodiments, a data type of sample data may be determined based on the type of the secondary imaging data model. Take the sensitivity distribution model as an example, sample secondary data and receiving sensitivity distributions of the RF coils 203 corresponding to the sample secondary data may be obtained and designated as the sample data. Further, a plurality of sample pairs (each of which includes sample secondary data and corresponding receiving sensitivity distribution of the RF coils 203) may be determined and a sensitivity distribution training sample set may be determined based on the plurality of sample pairs. Then a pre-established sensitivity distribution model may be trained based on the sensitivity distribution training sample set and a trained sensitivity distribution model may be obtained. It should be understood that a trained tissue boundary model and/or a trained k-space high frequency model may be obtained in a similar way.

It should be understood that the above description regarding obtaining the secondary imaging data by using the secondary imaging data model is illustrative and not intended to be limiting. The secondary imaging data may be obtained based on the secondary data in various ways, for example, according to a preset rule, according to a mathematical operation, according to a simulation approach, etc.

In 530, a reconstructed image (e.g., an MR image) may be generated based on the primary imaging data and the secondary imaging data. The reconstructed image may be generated by the processing device 140 or the MR image reconstruction device 1100 (e.g., a reconstructed image generation module 1130) illustrated in FIG. 11.

In some embodiments, the primary imaging data and the secondary imaging data may be fused and the reconstructed image may be generated based on the fused data. For example, it is assumed that the primary imaging data may include data associated with a central region of the target region and the secondary imaging data may include data associated with an edge region of the target region, the primary imaging data and the secondary imaging data may be fused and a reconstructed image may be generated based on the fused data.

In some embodiments, primary data in image domain corresponding to the primary imaging data and secondary data in image domain corresponding to the secondary imaging data may be fused and the reconstructed image of the target region may be generated based on the fused data in image domain. For example, as described above, a first image may be reconstructed based on the primary imaging data and a second image may be reconstructed based on the secondary imaging data. Further, the reconstructed image of the target region may be generated by combining the first image and the second image. Specifically, pixels or voxels corresponding to tissues with a relatively large physiological motion amplitude may be obtained from the first image and pixels or voxels corresponding to tissues with a relatively small physiological motion amplitude may be obtained from the second image.

In some embodiments, a k-space corresponding to the primary imaging data and a k-space corresponding to the secondary imaging data may be fused and the reconstructed image of the target region may be generated based on the fused k-space. Specifically, a first k-space may be generated based on the primary imaging data and a second k-space may be generated based on the secondary imaging data. Further, the reconstructed image may be generated based on the first k-space and the second k-space. More descriptions regarding obtaining the reconstructed image based on the k-space may be found elsewhere in the present disclosure (e.g., FIG. 8 and the description thereof).

In some embodiments, the reconstructed image may be generated based on the primary imaging data and the secondary imaging data according to a preset image reconstruction algorithm. Exemplary reconstruction algorithms may include an iterative reconstruction algorithm (e.g., a statistical reconstruction algorithm), a Fourier slice theorem algorithm, a fan-beam reconstruction algorithm, an analytic reconstruction algorithm, an algebraic reconstruction technique (ART), a simultaneous algebra reconstruction technique (SART), a filtered back projection (FBP) technique, a Feldkamp-Davis-Kress (FDK) reconstruction technique, or the like, or any combination thereof.

In some embodiments, the reconstructed image may be generated based on the primary imaging data and the secondary imaging data according to a trained image reconstruction model. For example, the primary imaging data and the secondary imaging data may be input into the trained image reconstruction model and a reconstructed image may be obtained based on an output of the image reconstruction model. As described above, a type of the image reconstruction model may be determined based on the data type of the secondary imaging data. Similarly, the type of the image reconstruction model may include a sensitivity image reconstruction model, a tissue boundary image reconstruction model, a k-space high-frequency image reconstruction model, or the like, or any combination thereof.

In some embodiments, the trained image reconstruction model may be trained based on a training process. For example, sample primary imaging data, sample secondary imaging data, and sample reconstructed images (which may be set as labels) corresponding to the sample primary imaging data and the sample secondary imaging data may be obtained and a second training sample set may be determined based on the sample primary imaging data, the sample secondary imaging data, and the sample reconstructed images. Further, a pre-established image reconstruction model (e.g., a preliminary image reconstruction model) may be trained based on the second training sample set. Finally, a trained image reconstruction model may be obtained. For example, the second training sample set may be input into the pre-established image reconstruction model. When a certain condition is satisfied (e.g., a count of iterations is larger than a threshold, a value of a loss function is less than a threshold), an image reconstruction model corresponding to a current iteration may be designated as the trained image reconstruction model.

In some embodiments, historical primary imaging data, historical secondary imaging data, and historical reconstructed images in historical magnetic resonance scanning may be obtained and designated as the sample primary imaging data, the sample secondary imaging data, and the sample reconstructed images respectively. Further, a plurality of sample pairs (each of which includes sample primary imaging data and sample secondary imaging data and corresponding sample reconstructed images) may be determined and the second training sample set may be determined based on the plurality of sample pairs. Then the pre-established image reconstruction model may be trained based on the second training sample set and a trained image reconstruction model may be obtained.

In some embodiments, a data type of sample data may be determined based on the type of the image reconstruction model. Take the sensitivity distribution image reconstruction model as an example, sample primary imaging data, sample receiving sensitivity distributions of the RF coils 203, and corresponding sample reconstructed images may be obtained and designated as the sample data. Further, a plurality of sample pairs (each of which includes sample primary imaging data and sample receiving sensitivity distribution of the RF coils 203 and corresponding sample reconstructed images) may be determined and a sensitivity distribution image reconstruction training sample set may be determined based on the plurality of sample pairs. Then a pre-established sensitivity distribution image reconstruction model may be trained based on the sensitivity distribution image reconstruction training sample set and a trained sensitivity distribution image reconstruction model may be obtained. It should be understood that a trained tissue boundary image reconstruction model and/or a trained k-space high-frequency image reconstruction model may be obtained in a similar way.

According to the operations illustrated in process 500, primary imaging data and secondary data of a target region may be obtained; the secondary data may be input into a trained secondary imaging data model and secondary imaging data may be obtained based on an output of the secondary imaging data model; a reconstructed image may be generated based on the primary imaging data and the secondary imaging data. The secondary imaging data may be obtained based on a trained secondary imaging data model and the reconstructed image may be generated based on the primary imaging data and the secondary imaging data. As a result, the amount of required primary imaging data may be reduced by introducing the secondary data into the image reconstruction, thereby shortening the scanning time and improving the quality of a reconstructed image, for example, improving the signal-to-noise ratio of the reconstructed image, suppressing artifacts in the reconstructed image, etc.

It should be noted that the above description of the process 500 is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure.

Figure 6:
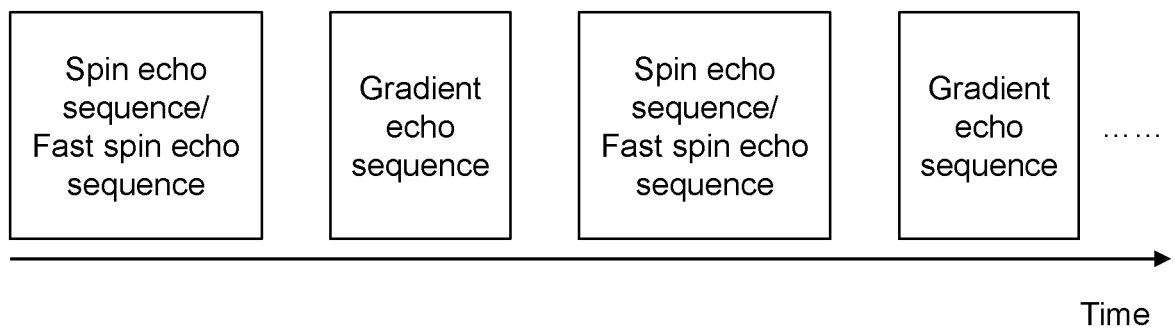
FIG. 6 is a schematic diagram illustrating an exemplary signal collection process in a magnetic resonance imaging according to some embodiments of the present disclosure.

FIG. 6 is a schematic diagram illustrating an exemplary signal collection process in a magnetic resonance imaging according to some embodiments of the present disclosure.

As illustrated in FIG. 6, a spin echo sequence (or a fast spin echo sequence) and a gradient echo sequence may be alternately applied to collect the primary imaging data and the secondary data. As used herein, the spin echo sequence may refer to a sequence under which an excitation pulse is applied first, then a refocusing pulse is applied with a corresponding encoding gradient, and a spin echo signal may be collected after the refocusing pulse is applied. The time between applications of two consecutive excitation pulses may be a repetition time (TR) of the spin echo sequence. In some embodiments, a spin echo sequence may include one or more TRs. The fast spin echo sequence may refer to sequence under which an excitation pulse is applied first, then a plurality of refocusing pulses are applied with corresponding encoding gradients, and a spin echo signal may be collected after each refocusing pulse is applied. Similarly, a fast spin echo sequence may also include one or more TRs. A gradient echo sequence may refer to a sequence under which an excitation pulse is applied with a corresponding encoding gradient and a signal or a series of signals may be collected. The excitation pulse may be applied repeatedly. The time between applications of two consecutive excitation pulses may be a repetition time (TR) of the gradient echo sequence.

It should be noted that the above description is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. For example, according to actual imaging needs, any other type of sequence may be applied to collect the primary imaging data and the secondary data.

Figure 7:
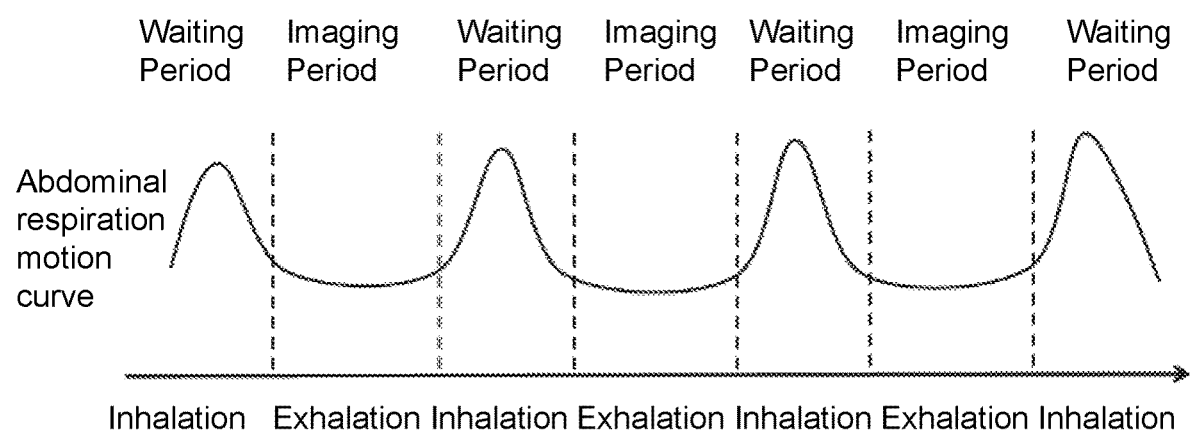
FIG. 7 is a schematic diagram illustrating an exemplary process for determining an imaging period and a waiting period of a magnetic resonance scanning process according to some embodiments of the present disclosure.

FIG. 7 is a schematic diagram illustrating an exemplary process for determining an imaging period and a waiting period of a magnetic resonance scanning process according to some embodiments of the present disclosure.

In some embodiments, a physiological motion of the subject may be monitored and an imaging period and a waiting period of the magnetic resonance scanning process may be determined based on the physiological motion of the subject. The imaging period may correspond to a periodic phase in which an amplitude of the physiological motion is less than or equal to a preset threshold and the waiting period may correspond to a periodic phase in which the amplitude of the physiological motion is larger than the preset threshold. For example, the physiological motion of the subject may be represented as a time-varying waveform with time as abscissa and the amplitude as ordinate. Accordingly, the imaging period and the waiting period may be determined based on the time-varying waveform.

In some embodiments, as described in connection with operation 510, the physiological motion may include a respiration motion, a cardiac motion, a blood vessel fluctuation, a gastrointestinal motility, or the like, or any combination thereof. A specific physiological motion may be monitored based on specific imaging requirements. For example, if the target region is a chest cavity, a cardiac motion of the subject may be monitored and the imaging period and the waiting period may be determined based on the cardiac motion. As another example, if the target region is a lung, a respiration motion of the subject may be monitored and the imaging period and the waiting period may be determined based on the respiration motion. As a further example, if the target region is a region including a blood vessel, a blood flow fluctuation of the subject may be monitored and the imaging period and the waiting period may be determined based on the blood flow fluctuation. As a result, the primary imaging data collected during the imaging period can meet the reconstruction requirements, thereby improving the quality of the image reconstructed based on the primary imaging data.

Further, the imaging period and the waiting period may be determined based on a motion threshold (e.g., a cardiac motion threshold, a respiration motion threshold, a blood flow fluctuation threshold), which may be a default setting of the imaging system 100 or may be adjustable under different situations. For example, when the cardiac motion of the subject is monitored, whether the heart is in the diastolic phase or the systolic phase may be determined based on the cardiac motion threshold. Then a periodic phase corresponding to the diastolic phase may be determined as the imaging period and a periodic phase corresponding to the systolic phase may be determined as the waiting period. As another example, when the respiration motion of the subject is monitored, whether the respiration motion is an inhalation state or an exhalation state may be determined based on the respiration motion threshold. Then a periodic phase corresponding to the exhalation state may be determined as the imaging period and a periodic phase corresponding to the inhalation state may be determined as the waiting period.

Take an abdominal respiration motion as an example, as illustrated in FIG. 7, the abdominal respiration motion of the subject is monitored and a motion curve with time as abscissa and a motion amplitude as ordinate is shown. According to the motion curve, an inhalation interval corresponding to an inhalation state and an exhalation interval corresponding to an exhalation state may be determined. Further, the inhalation interval may be determined as the waiting period and the exhalation interval may be determined as the imaging period.

It should be noted that the above description is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure.

Figure 8:
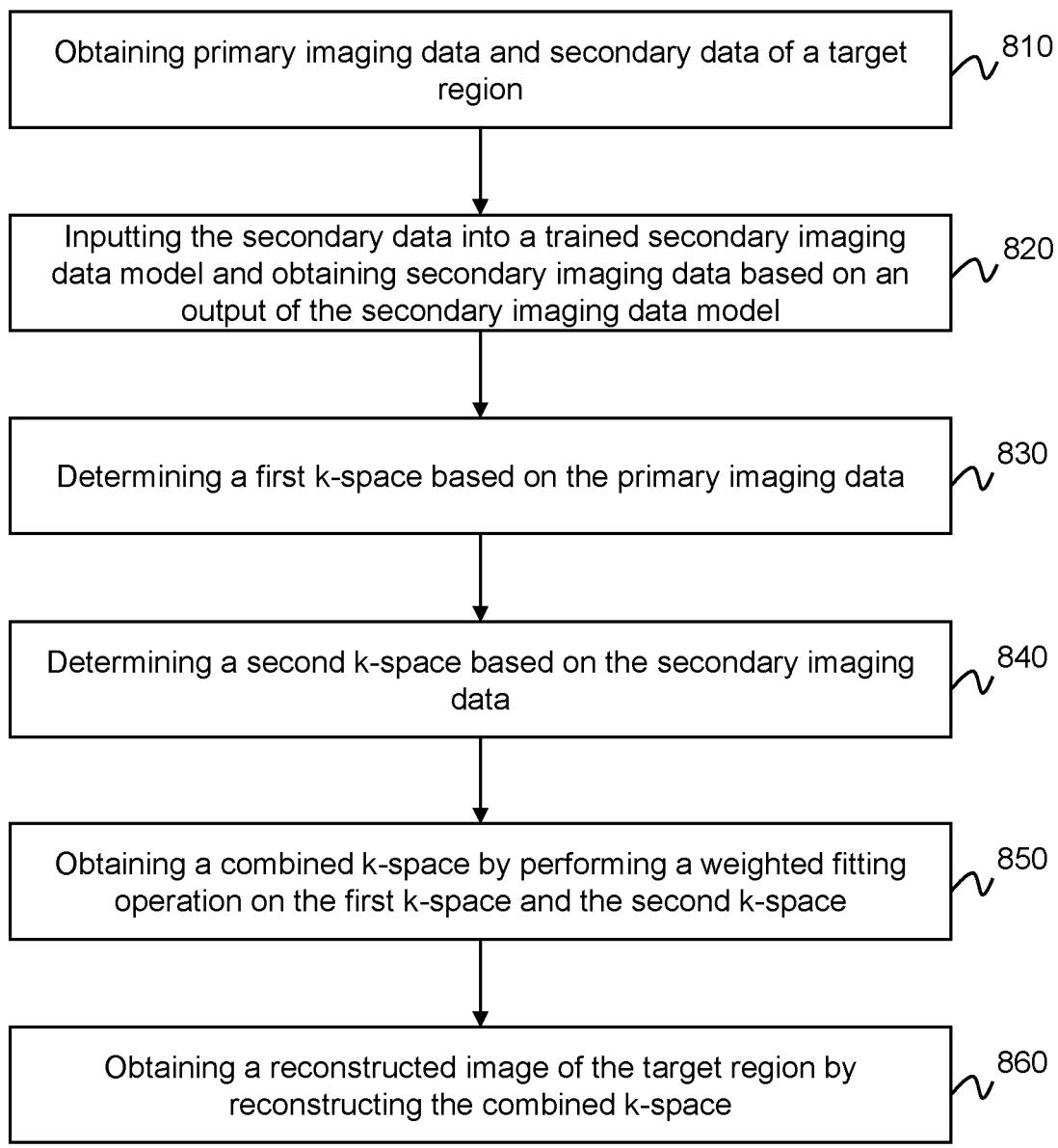
FIG. 8 is a flowchart illustrating an exemplary process for reconstructing a magnetic resonance image according to some embodiments of the present disclosure.

FIG. 8 is a flowchart illustrating an exemplary reconstructing a magnetic resonance image according to some embodiments of the present disclosure. In some embodiments, at least part of process 800 may be performed by the processing device 140 (implemented in, for example, the computing device 300 shown in FIG. 3). For example, the process 800 may be stored in a storage device (e.g., the storage device 150, the storage 320, the storage 490) in the form of instructions (e.g., an application), and invoked and/or executed by the processing device 140 (e.g., the processor 310 illustrated in FIG. 3, the CPU 440 illustrated in FIG. 4, one or more modules illustrated in FIG. 11). The operations of the illustrated process presented below are intended to be illustrative. In some embodiments, the process 800 may be accomplished with one or more additional operations not described, and/or without one or more of the operations discussed. Additionally, the order in which the operations of the process 800 as illustrated in FIG. 8 and described below is not intended to be limiting.

In 810, primary imaging data and secondary data of a target region may be obtained. The primary imaging data and the secondary data may be obtained by the processing device 140 or the MR image reconstruction device 1100 (e.g., the raw data obtaining module 1110) illustrated in FIG. 11.

As described in connection with operation 510, a magnetic resonance scanning process may include an imaging period and a waiting period. The primary imaging data may be obtained by applying a first sequence during the imaging period and the secondary data may be obtained by applying a second sequence during the waiting period or the whole scanning process.

In 820, the secondary data may input into a trained secondary imaging data model and secondary imaging data may be obtained based on an output of the secondary imaging data model. The trained secondary imaging data model may be obtained from a training module of the MR image reconstruction device 1100 illustrated in FIG. 11 or a storage device (e.g., the storage device 150) disclosed elsewhere in the present disclosure. The secondary imaging data may be obtained by the processing device 140 or the MR image reconstruction device 1100 (e.g., the secondary imaging data module 1120) illustrated in FIG. 11.

As described in connection with operation 520, a type of the secondary imaging data model may be determined based on a data type of the secondary imaging data. The data type of the secondary imaging data may include a receiving sensitivity distribution of the RF coils 203, tissue boundary information, a k-space high frequency component, or the like, or any combination thereof. Accordingly, the type of the secondary imaging data model may include a sensitivity distribution model, a tissue boundary model, a k-space high-frequency model, or the like, or any combination thereof.

In 830, a first k-space may be determined based on the primary imaging data.

In 840, a second k-space may be determined based on the secondary imaging data.

Figure 11:
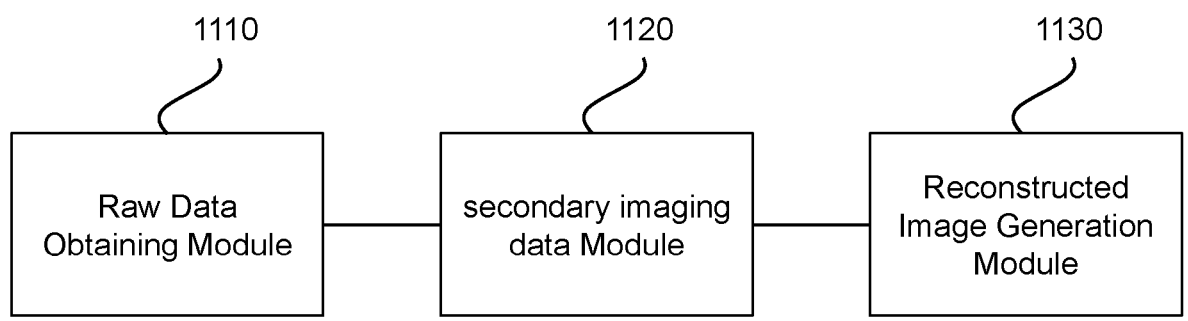
FIG. 11 is a block diagram illustrating an exemplary magnetic resonance image reconstruction device according to some embodiments of the present disclosure.

In some embodiments, the first k-space and/or the second k-space may be determined by the processing device 140 or the MR image reconstruction device 1100 (e.g., the reconstructed image generation module 1130) illustrated in FIG. 11. As used herein, the k-space (also referred to as "Fourier space") may refer to a filling space of raw data associated with MR signals with spatial positioning encoding information. For an MRI scanning, MR signals may be filled into the k-space and an MR image may be reconstructed by performing a Fourier transformation on the k-space data. In general, central region(s) of the k-space may correspond to relatively low spatial frequency, which may affect signal-to-noise and/or contrast of the MR image; outer peripheral region(s) of the k-space may correspond to relatively high spatial frequency, which may affect sharpness of the MR image, which means that k-space data in the central region(s) of the k-space may contribute to the reconstructed image more than that in the outer peripheral region(s).

In some embodiments, the primary imaging data (which may be collected based on an undersampling technique)

obtained during the imaging period may be filled into the central region(s) of the k-space to determine the first k-space; the secondary imaging data obtained during the waiting period may be filled into the outer peripheral region(s) of the k-space to determine the second k-space. In some embodiments, the primary imaging data and/or the secondary imaging data may be filled into the k-space according to a filling technique. Exemplary filling techniques may include a linear k-space filling technique, a Centric k-space filling technique, an elliptical k-space filling technique, a radial k-space filling technique, a keyhole k-space filling technique, a half Fourier k-space filling technique, a partial echo k-space filling technique, or the like, or any combination thereof.

In 850, a combined k-space may be obtained by performing a weighted fitting operation on the first k-space and the second k-space. The combined k-space may be obtained by the processing device 140 or the MR image reconstruction device 1100 (e.g., the reconstructed image generation module 1130) illustrated in FIG. 11.

In some embodiments, after determining the first k-space and the second k-space, a weighted fitting operation may be performed on the first k-space and the second k-space according to a preset fitting technique. In this way, advantages of the primary imaging data and the secondary imaging data may be fully utilized and combined in the combined k-space, thereby improving image quality of an image reconstructed based on the combined k-space.

In 860, a reconstructed image (e.g., an MR image) of the target region may be generated by reconstructing the combined k-space. The reconstructed image may be generated by the processing device 140 or the MR image reconstruction device 1100 (e.g., the reconstructed image generation module 1130) illustrated in FIG. 11.

In some embodiments, the reconstructed image of the target region may be generated by performing a Fourier transform on k-space data in the combined k-space. Specifically, the spatial positioning encoding information in the combined k-space may be decoded and MR signals of different frequencies, phases, and/or amplitudes may be obtained. As used herein, the different frequencies and phases may represent different spatial positions and the amplitudes may represent intensities of the MR signals. The reconstructed image of the target region may be generated by assigning the MR signals of different frequencies, phases, and amplitudes to corresponding pixels.

According to the operations illustrated in process 800, a first k-space may be determined based on the primary imaging data and a second k-space may be determined based on the secondary imaging data. Further, a combined k-space may be determined by performing a weighted fitting operation on the first k-space and the second k-space. Finally, a reconstructed image of the target region may be generated by reconstructing the combined k-space. According to the present disclosure, advantages of the primary imaging data and the secondary imaging data may be combined in the combined k-space and the image quality of the reconstructed image may be improved.

It should be noted that the above description of the process 800 is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. For example, any other reconstruction technique may be used to obtain the reconstructed image. Exemplary reconstruction techniques may include a projection reconstruction technique, a spiral reconstruction technique, or the like, or any combination thereof.

Figure 9:
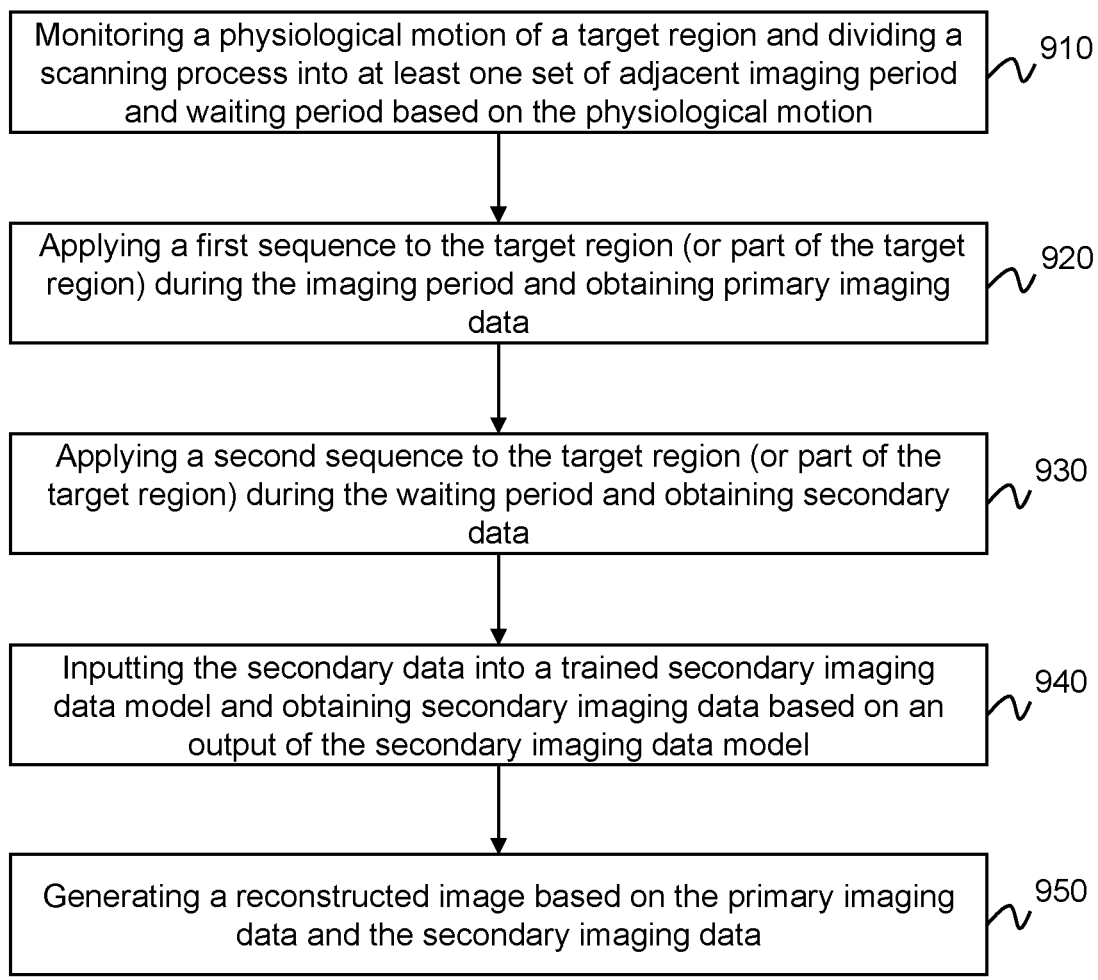
FIG. 9 is a flowchart illustrating an exemplary reconstructing a magnetic resonance image according to some embodiments of the present disclosure.

FIG. 9 is a flowchart illustrating an exemplary process for reconstructing a magnetic resonance image according to some embodiments of the present disclosure. In some embodiments, at least part of process 900 may be performed by the processing device 140 (implemented in, for example, the computing device 300 shown in FIG. 3). For example, the process 900 may be stored in a storage device (e.g., the storage device 150, the storage 320, the storage 490) in the form of instructions (e.g., an application), and invoked and/or executed by the processing device 140 (e.g., the processor 310 illustrated in FIG. 3, the CPU 440 illustrated in FIG. 4, one or more modules illustrated in FIG. 12). The operations of the illustrated process presented below are intended to be illustrative. In some embodiments, the process 900 may be accomplished with one or more additional operations not described, and/or without one or more of the operations discussed. Additionally, the order in which the operations of the process 900 as illustrated in FIG. 9 and described below is not intended to be limiting.

In 910, a physiological motion of a target region may be monitored and a scanning process may be divided into at least one set of adjacent imaging period and waiting period based on the physiological motion. The physiological motion of a target region may be monitored by the processing device 140 or an MR image reconstruction device 1200 (e.g., a scanning process dividing module 1210) illustrated in FIG. 12.

As described elsewhere in the present disclosure, the physiological motion may include a respiration motion, a cardiac motion, a blood vessel fluctuation, a gastrointestinal motility, or the like, or any combination thereof.

In some embodiments, as described elsewhere in the present disclosure, the imaging period may correspond to a periodic phase in which an amplitude of the physiological motion is less than or equal to a preset threshold; the waiting period may correspond to a periodic phase in which the amplitude of the physiological motion is larger than the preset threshold. More descriptions regarding the imaging period and the waiting period may be found elsewhere in the present disclosure (e.g., FIG. 7, FIG. 10, and the descriptions thereof).

In 920, a first sequence may be applied to the target region (or part (e.g., a first region with a physiological motion amplitude larger than a threshold) of the target region) during the imaging period and primary imaging data may be obtained. The primary imaging data may be obtained by the processing device 140 or the MR image reconstruction device 1200 (e.g., a primary imaging data module 1230) illustrated in FIG. 12.

In 930, a second sequence may be applied to the target region (or part (e.g., a second region with a physiological motion amplitude less than the threshold) of the target region) during the waiting period and secondary data may be obtained. The secondary data may be obtained by the processing device 140 or the MR image reconstruction device 1200 (e.g., a secondary data obtaining module 1220) illustrated in FIG. 12.

As described elsewhere in the present disclosure, after determining the imaging period and the waiting period, the first sequence and the second sequence may be determined based on specific imaging requirements. Further, the primary imaging data may be obtained by applying the first sequence to the target region (or part of the target region) during the imaging period and the secondary data may be obtained by applying the second sequence to the target region (or part of the target region) during the waiting period.

In some embodiments, the first sequence may include a free induction decay (FID) sequence, a spin echo (SE) sequence, a gradient recalled echo (GRE) sequence, a hybrid sequence, or the like, or any combination thereof. The second sequence may include a navigator echo sequence, a scout scan sequence, a fast scout scan sequence, or the like, or any combination thereof.

In 940, the secondary data may be input into a trained secondary imaging data model and secondary imaging data may be obtained based on an output of the secondary imaging data model. The trained secondary imaging data model from the training module of an MR image reconstruction device 1200 illustrated in FIG. 12 or a storage device (e.g., the storage device 150) disclosed elsewhere in the present disclosure. The secondary imaging data may be obtained by the processing device 140 or the MR image reconstruction device 1200 (e.g., a secondary imaging data module 1240) illustrated in FIG. 12. More descriptions regarding the trained secondary imaging data model may be found elsewhere in the present disclosure (e.g., FIG. 5, FIG. 8, and the descriptions thereof).

In 950, a reconstructed image (e.g., an MR image) may be generated based on the primary imaging data and the secondary imaging data. The reconstructed image may be generated by the processing device 140 or the MR image reconstruction device 1200 (e.g., a reconstructed image generation module 1250) illustrated in FIG. 12. More descriptions regarding the generation of the reconstructed image may be found elsewhere in the present disclosure (e.g., FIG. 5, FIG. 8, and the descriptions thereof).

According to the operations illustrated in process 900, the physiological motion of the target region may be monitored and the scanning process may be divided into at least one set of adjacent imaging period and waiting period based on the physiological motion. Further, the first sequence may be applied to the target region (or part (e.g., a first region with a physiological motion amplitude larger than a threshold) of the target region) during the imaging period and the primary imaging data may be obtained, the second sequence may be applied to the target region (or part (e.g., a second region with a physiological motion amplitude less than the threshold) of the target region) during the waiting period and the secondary data may be obtained. Furthermore, the secondary data may be input into a trained secondary imaging data model and the secondary imaging data may be obtained based on an output of the secondary imaging data model. Moreover, a reconstructed image may be generated based on the primary imaging data and the secondary imaging data. In this way, the waiting period of the scanning process may be fully utilized and the amount of required primary imaging data may be reduced by introducing the secondary data into the image reconstruction, thereby shortening the scanning time and improving the quality of a reconstructed image.

It should be noted that the above description of the process 900 is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure.

Figure 10:
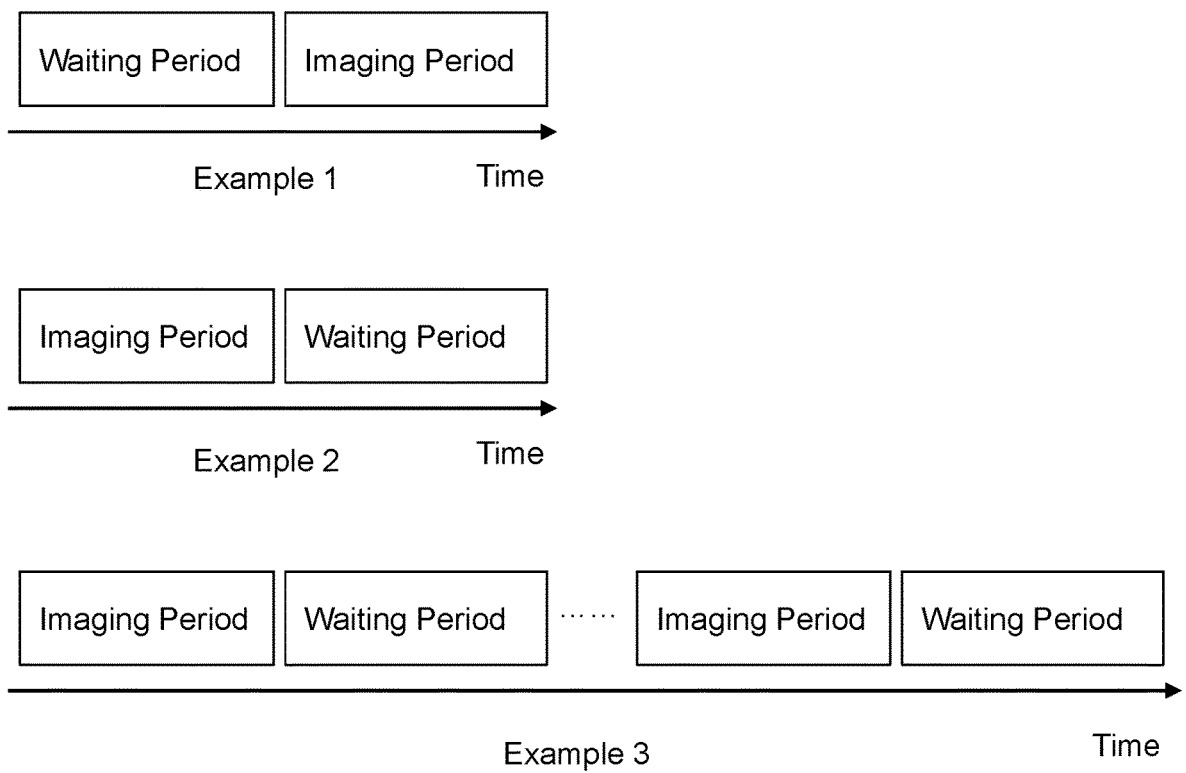
FIG. 10 is a schematic diagram illustrating exemplary magnetic resonance scanning processes according to some embodiments of the present disclosure.

FIG. 10 is a schematic diagram illustrating exemplary magnetic resonance scanning processes according to some embodiments of the present disclosure. For example, as illustrated in example 1, the scanning process may be divided into a waiting period and an imaging period. As another example, as illustrated in example 2, the scanning process may be divided into an imaging period and a waiting period. As a further example, as illustrated in example 3, the scanning process may be divided into a plurality of sets of adjacent imaging periods and waiting periods.

FIG. 11 is a block diagram illustrating an exemplary MR image reconstruction device according to some embodiments of the present disclosure. In some embodiments, the MR image reconstruction device 1100 may be implemented on various devices (e.g., the computing device 300 illustrated in FIG. 3, the mobile device 400 illustrated in FIG. 4). In some embodiments, the MR image reconstruction device 1100 may be integrated into the processing device 140. As shown in FIG. 11, the MR image reconstruction device 1100 may include a raw data obtaining module 1110, a secondary imaging data module 1120, and a reconstructed image generation module 1130.

The raw data obtaining module 1110 may be configured to obtain primary imaging data and secondary data associated with a target region of a subject. In some embodiments, the raw data obtaining module 1110 may be further configured to apply a first sequence during an imaging period and apply a second sequence during a waiting period. In some embodiments, the raw data acquisition module 1110 may include a primary imaging data obtaining unit and a secondary data obtaining unit. The primary imaging data obtaining unit may be configured to obtain the primary imaging data and the secondary data obtaining unit may be configured to obtain the secondary data.

The secondary imaging data module 1120 may be configured to determine secondary imaging data based on the secondary data by using a trained model. In some embodiments, the trained model may include an artificial neural network model. The secondary imaging data module 1120 may determine a type of the trained model based on a data type of the secondary imaging data and further determine the secondary imaging data based on the secondary data by using the trained model.

The reconstructed image generation module 1130 may be configured to reconstruct an MR image based on the primary imaging data and the secondary imaging data. In some embodiments, the reconstructed image generation module 1130 may generate a reconstructed image by using a trained image reconstruction model. In some embodiments, the reconstructed image generation module 1130 may fuse the primary imaging data and the secondary imaging data and reconstruct the MR image based on the fused data. In some embodiments, the reconstructed image generation module 1130 may fuse primary data in image domain corresponding to the primary imaging data and secondary data in image domain corresponding to the secondary imaging data and generate the reconstructed image of the target region based on the fused data in image domain. In some embodiments, the reconstructed image generation module 1130 may fuse a k-space corresponding to the primary imaging data and a k-space corresponding to the secondary imaging data and generate the reconstructed image of the target region based on the fused k-space.

According to the embodiment, primary imaging data and secondary data of a target region may be obtained; the secondary data may be input into a trained secondary imaging data model and secondary imaging data may be obtained based on an output of the secondary imaging data model; a reconstructed image may be generated based on the primary imaging data and the secondary imaging data. The secondary imaging data may be obtained based on a trained secondary imaging data model and the reconstructed image may be generated based on the primary imaging data and the secondary imaging data. As a result, the amount of required primary imaging data may be reduced by introducing the secondary data into the image reconstruction, thereby shortening the scanning time and improving the quality of a reconstructed image, for example, improving the signal-to-noise ratio of the reconstructed image, suppressing artifacts in the reconstructed image, etc.

The modules in the MR image reconstruction device 1100 may be connected to or communicate with each other via a wired connection or a wireless connection. The wired connection may include a metal cable, an optical cable, a hybrid cable, or the like, or any combination thereof. The wireless connection may include a Local Area Network (LAN), a Wide Area Network (WAN), a Bluetooth, a ZigBee, a Near Field Communication (NFC), or the like, or any combination thereof. Two or more of the modules may be combined as a single module, and any one of the modules may be divided into two or more units.

For example, the MR image reconstruction device 1100 may also include a scanning process determination module, which may be configured to monitor a physiological motion of the subject and determine an imaging period and a waiting period of the magnetic resonance scanning process based on the physiological motion of the subject. As another example, the MR image reconstruction device 1100 may also include a training module configured to train the secondary imaging data model or the image reconstruction model based on a sample data set. As a further example, the training module may be unnecessary and the secondary imaging data model or the image reconstruction model may be obtained from a storage device (e.g., the storage device 150) disclosed elsewhere in the present disclosure.

Figure 12:
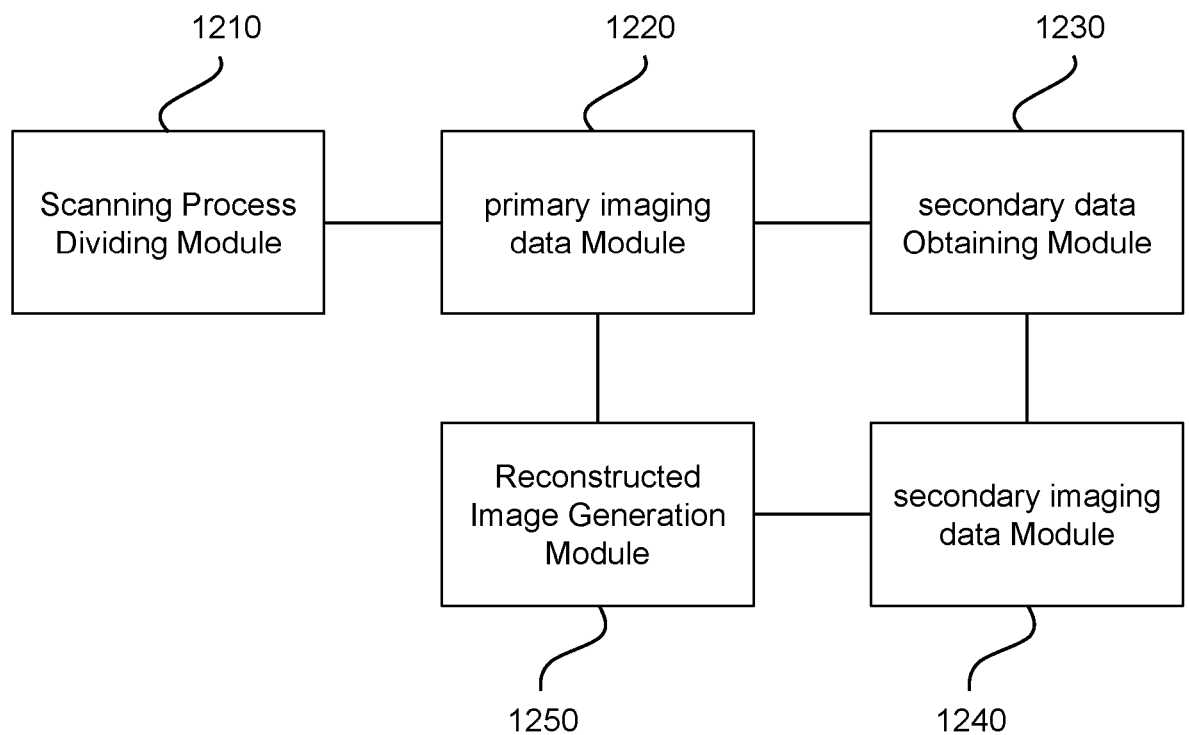
FIG. 12 is a block diagram illustrating an exemplary magnetic resonance imaging device according to some embodiments of the present disclosure.

FIG. 12 is a block diagram illustrating an exemplary MR image reconstruction device according to some embodiments of the present disclosure. In some embodiments, the MR image reconstruction device 1200 may be implemented on various devices (e.g., the computing device 300 illustrated in FIG. 3, the mobile device 400 illustrated in FIG. 4). In some embodiments, the MR image reconstruction device 1200 may be integrated into the processing device 140. As shown in FIG. 12, the MR image reconstruction device may include a scanning process dividing module 1210, a primary imaging data module 1220, a secondary data obtaining module 1230, a secondary imaging data module 1240, and a reconstructed image generation module 1250.

The scanning process dividing module 1210 may be configured to monitor a physiological motion of the subject and determine an imaging period and a waiting period of the magnetic resonance scanning process based on the physiological motion of the subject.

The primary imaging data module 1220 may be configured to apply a first sequence to the target region (or part (e.g., a first region with a physiological motion amplitude larger than a threshold) of the target region) during the imaging period and obtain primary imaging data.

The secondary data obtaining module 1230 may be configured to apply a second sequence to the target region (or part (e.g., a second region with a physiological motion amplitude less than the threshold) of the target region) during the waiting period and obtain secondary data.

The secondary imaging data module 1240 may be configured to input the secondary data into a trained secondary imaging data model and obtain secondary imaging data based on an output of the secondary imaging data model.

The reconstructed image generation module 1250 may be configured to generate a reconstructed image based on the primary imaging data and the secondary imaging data.

According to the embodiment, the physiological motion of the target region may be monitored and the scanning process may be divided into at least one set of adjacent imaging period and waiting period based on the physiological motion. Further, the first sequence may be applied to the target region (or part (e.g., a first region with a physiological motion amplitude larger than a threshold) of the target region) during the imaging period and the primary imaging data may be obtained; the second sequence may be applied to the target region (or part (e.g., a second region with a physiological motion amplitude less than the threshold) of the target region) during the waiting period and the secondary data may be obtained. Furthermore, the secondary data may be input into a trained secondary imaging data model and the secondary imaging data may be obtained based on an output of the secondary imaging data model. Moreover, a reconstructed image may be generated based on the primary imaging data and the secondary imaging data in this way, the waiting period of the scanning process may be fully utilized and the amount of required primary imaging data may be reduced by introducing the secondary data into the image reconstruction, thereby shortening the scanning time and improving the quality of a reconstructed image.

The modules in the MR image reconstruction device 1200 may be connected to or communicate with each other via a wired connection or a wireless connection. The wired connection may include a metal cable, an optical cable, a hybrid cable, or the like, or any combination thereof. The wireless connection may include a Local Area Network (LAN), a Wide Area Network (WAN), a Bluetooth, a ZigBee, a Near Field Communication (NFC), or the like, or any combination thereof. Two or more of the modules may be combined as a single module, and any one of the modules may be divided into two or more units.

For example, the MR image reconstruction device 1200 may also include a training module configured to train the secondary imaging data model or the image reconstruction model based on a sample data set. As another example, the training module may be unnecessary and the secondary imaging data model or the image reconstruction model may be obtained from a storage device (e.g., the storage device 150) disclosed elsewhere in the present disclosure.

Figure 13:
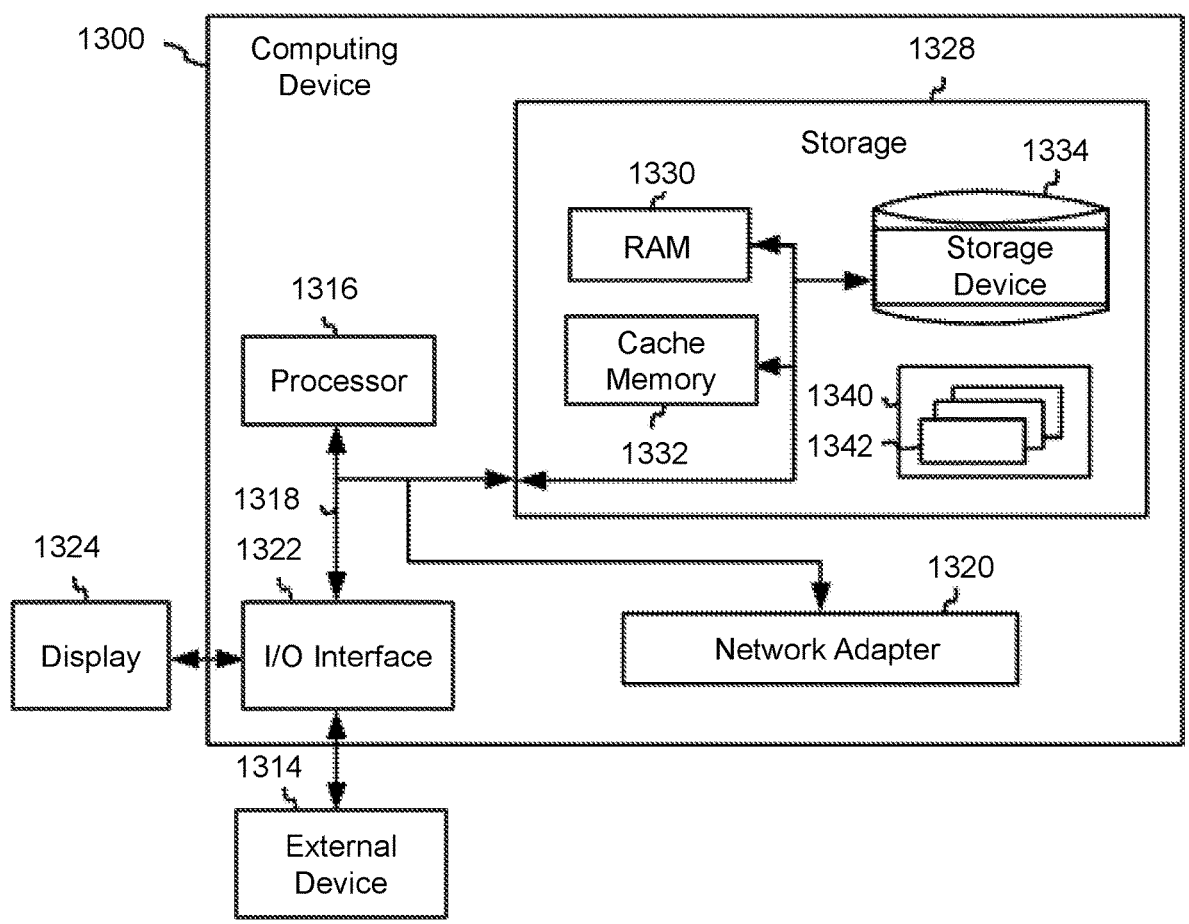
FIG. 13 is a schematic diagram illustrating an exemplary computing device according to some embodiments of the present disclosure.

FIG. 13 is a schematic diagram illustrating an exemplary computing device according to some embodiments of the present disclosure. In some embodiments, the processing device 140 may be implemented on the computing device 1300. In some embodiments, one or more components illustrated in FIG. 13 may be implemented in at least part of the computing device 300 illustrated in FIG. 3. For example, the processor 1316 may be implemented in at least a portion of the processor 310. As another example, the storage 1328 may be implemented in at least a portion of the storage 320.

As illustrated in FIG. 13, the computing device 1300 may include one or more processors 1316, a system storage 1328, and a bus 1318 connected to different components (including the system storage 1328 and/or the processor 1316) of the computing device 1300.

The bus 1318 may include one or more bus structures of several types, for example, a storage bus or a storage controller, a peripheral bus, a graphics acceleration port, or a local bus using any of various bus structures. Exemplary bus structures may include but not limited to Industry Standard Architecture (ISA) bus, Micro Channel Architecture (MAC) bus, Enhanced ISA bus, Video Electronics Standards Association (VESA) local bus, Peripheral Component Interconnect (PCI) bus, or the like, or any combination thereof.

The computing device 1300 may include a plurality of computer system readable media. The computer system readable media may include any available medium that can be accessed by the computing device 1300, including a volatile or a non-volatile medium, a removable or a non-removable medium, etc.

The system storage 1328 may include a computer system readable medium in a form of a volatile storage, such as a random access storage (RAM) 1330 and/or a cache memory 1332. The computing device 1300 may further include other removable or non-removable, volatile or non-volatile computer system storage media, etc. Merely by way of example, the storage device 1334 may be used to read and write a non-removable and non-volatile magnetic medium (generally referred to as a "hard disk drive", not shown in FIG. 13). Although not shown in FIG. 13, the computing device 1300 may also include a disk drive used for reading and writing to a removable non-volatile disk (e.g., a floppy disk) and an optical disc drive used for reading and writing to a removable non-volatile disc (e.g., a CD-ROM, a DVD-ROM, or other optical media). In these situations, each drive may be connected to the bus 1318 via one or more data medium interfaces. The system storage 1328 may include at least one program product with a set (e.g., at least one) of program modules configured to perform the functions of the embodiments of the present disclosure.

A program/utility 640 including a set (at least one) of program modules 1342 may be stored in, for example, the storage 1328. The program modules 1342 may include but not limited to an operating system, one or more applications, other program modules, and program data, wherein each or any combination thereof may include an implementation of a network environment. The program modules 1342 may perform the functions and/or methods of the embodiments of the present disclosure.

The computing device 1300 may also communicate with one or more external devices 1314 (e.g., a keyboard, a pointing device, a display 1324). The computing device 1300 may also communicate with a device that enables a user to interact with the computing device 1300, and/or may communicate with any device (e.g., a network card, a modem) that enables the computing device 1300 to communicate with one or more other computing devices. The communication may be executed via an input/output (I/O) interface 1322. Moreover, the computing device 1300 may also communicate with one more networks (e.g., a local area network (LAN), a wide area network (WAN), and/or a public network, such as the Internet) via a network adapter 1320. As shown in FIG. 13, the network adapter 1320 may communicate with other components of the computing device 1300 via the bus 1318. It should be understood that, although not shown in FIG. 13, other hardware and/or software modules may be used in combination with the computing device 1300, including but not limited to microcode, a device driver, a redundant processing unit, an external disk drive array, a RAID system, a tape drive, a data backup storage system, or the like, or any combination thereof.

The processor 1316 may execute various function applications and data processing by running a program stored in the system storage 1328. For example, the processor 1316 may implement the magnetic resonance imaging method provided in any of the embodiments of the present disclosure.

Figure 14:
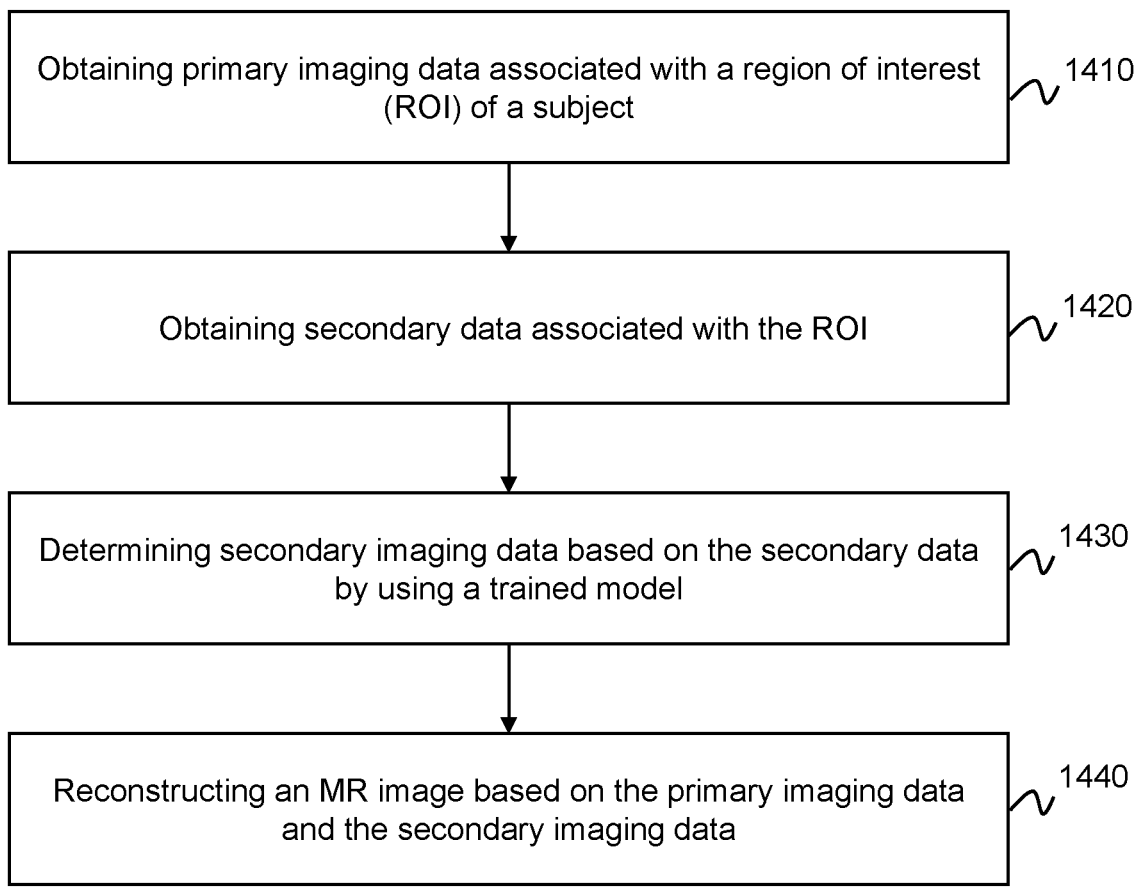
FIG. 14 is a flowchart illustrating an exemplary process for reconstructing a magnetic resonance image according to some embodiments of the present disclosure.

FIG. 14 is a flowchart illustrating an exemplary process for reconstructing an MR image according to some embodiments of the present disclosure. In some embodiments, at least part of process 1400 may be performed by the processing device 140 (implemented in, for example, the computing device 300 shown in FIG. 3). For example, the process 1400 may be stored in a storage device (e.g., the storage device 150, the storage 320, the storage 490) in the form of instructions (e.g., an application), and invoked and/or executed by the processing device 140 (e.g., the processor 310 illustrated in FIG. 3, the CPU 440 illustrated in FIG. 4, one or more modules illustrated in FIG. 11 and/or FIG. 12). The operations of the illustrated process presented below are intended to be illustrative. In some embodiments, the process 1400 may be accomplished with one or more additional operations not described, and/or without one or more of the operations discussed. Additionally, the order in which the operations of the process 1400 as illustrated in FIG. 14 and described below is not intended to be limiting.

In 1410, the processing device 140 (e.g., the raw data obtaining module 1110 and/or the primary imaging data module 1220) may obtain primary imaging data associated with a region of interest (ROI) of a subject.

In 1420, the processing device 140 (e.g., the raw data obtaining module 1110 and/or the secondary data obtaining module 1230) may obtain secondary data associated with the ROI.

As described in connection with operation 510, the subject may be biological or non-biological. For example, the subject may include a living animal body, a human body (e.g., a patient), a man-made subject, or the like, or a combination thereof. The ROI may include a specific portion, organ, and/or tissue of the subject. For example, the ROI may include a head, a neck, a breast, a limb, an abdomen, a heart, a liver, a pelvis, or the like, or any combination thereof.

In some embodiments, the primary imaging data associated with the ROI may be necessary data for generating a reconstructed image associated with the ROI and the secondary data associated with the ROI may be unnecessary data for generating the reconstructed image. For example, the reconstructed image cannot be generated without the primary imaging data; whereas, the reconstructed image may still be obtained through some specific methods without the secondary data.

In some embodiments, the primary imaging data and/or the secondary data may correspond to various types. For example, the primary imaging data may be obtained when the ROI is in a preset state (e.g., a state in which an amplitude of a physiological motion of the subject is less than or equal to a preset threshold) and the secondary data may be obtained when the ROI is in a non-preset state (e.g., a state in which an amplitude of the physiological motion of the subject is larger than the preset threshold.) Accordingly, the primary imaging data may be less affected by the physiological motion than the secondary data. As another example, the primary imaging data may include MR signals obtained when the ROI is excited and the secondary data may include a motion state curve (which may be acquired by a motion detection device or may be obtained from an external resource) of the subject. As a further example, the primary imaging data may include data associated with a specific region (e.g., lesions, voxels) of the ROI and the secondary data may include reference data (e.g., contour information, topogram image information) associated with the ROI. As still a further example, the primary imaging data may include data associated with a sub-region (e.g., a sub-region with a physiological motion amplitude larger than a threshold) of the ROI and the secondary data may include data associated with another sub-region (e.g., a sub-region with a physiological motion amplitude less than the threshold) of the ROI. As still a further example, the primary imaging data may be collected based on a k-space under-sampling technique and the secondary data may correspond to a portion of the k-space where no data is collected.

In some embodiments, the primary imaging data may be acquired (or collected) during an imaging period and secondary data may be acquired during a waiting period. In some embodiments, the processing device 140 (e.g., the scanning process dividing module 1210) may monitor a physiological motion (e.g., a cardiac motion, a respiration motion, a blood flow fluctuation, a gastrointestinal motility) of the subject and determine the imaging period and the waiting period based on an amplitude of the physiological motion of the subject. For example, as described in connection with FIG. 7, the physiological motion of the subject may be represented as a time-varying waveform with time as abscissa and amplitude as ordinate. The processing device 140 may determine a period during which the amplitude of the physiological motion of the subject is less than or equal to a threshold as the imaging period and determine a period during which the amplitude of the physiological motion of the subject is larger than the threshold as the waiting period. More descriptions regarding the physiological motion, the imaging period, and/or the waiting period may be found elsewhere in the present disclosure (e.g., FIG. 5, FIG. 7, and the descriptions thereof).

In some embodiments, the secondary data may be acquired during the whole scanning process. An acquisition time of the secondary data may be determined according to a data type of the secondary data. For example, if the secondary data includes a motion state curve of the subject, the acquisition time of the secondary data may cover the whole scanning process.

In some embodiments, the primary imaging data may be acquired based on a first sequence (also referred to as "first MRI pulse sequence" which may be an imaging sequence) and the secondary data may be acquired based on a second sequence (also referred to as "second MRI pulse sequence" which may be an imaging sequence or not (e.g., a navigator echo sequence)). For example, the processing device 140 may obtain the primary imaging data by applying the first sequence on the ROI during the imaging period and the secondary data by applying the second sequence on the ROI during the waiting period. In some embodiments, the first sequence may include a free induction decay (FID) sequence, a spin echo (SE) sequence, a gradient recalled echo (GRE) sequence, a hybrid sequence, or the like, or any combination thereof; the second sequence may include a navigator echo sequence, a scout scan sequence, a fast scout scan sequence, or the like, or any combination thereof. For example, as described in connection with FIG. 6, the first sequence may be a fast spin echo (FSE) sequence and the second sequence may be a gradient echo sequence. As another example, the first sequence may be a first gradient echo sequence (which includes a magnetization-preparation pulse and one or more excitation pulses) and the second sequence may be a second gradient echo sequence (which includes one or more low angle pulses).

In some embodiments, the ROI may include a first sub-ROI and a second sub-ROI, accordingly, the primary imaging data may be associated with the first sub-ROI and the secondary data may be associated with the second sub-ROI. For example, the first sub-ROI may be central region(s) of the ROI and the second sub-ROI may be an outer peripheral region(s) of the ROI. As another example, the first sub-ROI may be a region in which the amplitude of the physiological motion of the subject is larger than a threshold and the second sub-ROI may be a region in which the amplitude of the physiological motion of the subject is less than or equal to the threshold.

In some embodiments, the processing device 140 may obtain the secondary data from an external device. For example, the secondary data may be a cardiac motion curve obtained using an external device such as an electrocardiogram (ECG) electrode, a pulse detecting clip, a finger sleeve, or the like, or any combination thereof. As another example, the secondary data may be a respiration motion curve obtained using an external device such as a pressure detecting sensor (e.g., an elastic breathing band, a respiratory pressure pad).

In 1430, the processing device 140 (e.g., the secondary imaging data module 1120 and/or the secondary imaging data module 1240) may determine secondary imaging data based on the secondary data by using a trained model. The processing device 140 may obtain the trained model from a training module (which may be integrated in the MR image reconstruction device 1100 or the MR image reconstruction device 1200) or a storage device (e.g., the storage device 150) disclosed elsewhere in the present disclosure.

As described in connection with operation 520, the trained model may include an artificial neural network model. The processing device 140 may determine a type of the trained model according to a data type of the secondary imaging data. The data type of the secondary imaging data may include a receiving sensitivity distribution of the RF coils 203, tissue boundary information, a k-space high frequency component, or the like, or any combination thereof. Accordingly, the type of the trained model may include a sensitivity distribution model, a tissue boundary model, a k-space high-frequency model, or the like, or any combination thereof. More descriptions of the trained model may be found elsewhere in the present disclosure (e.g., FIG. 5 and the description thereof).

In 1440, the processing device 140 (e.g., the reconstructed image generation module 1130 and/or the reconstructed image generation module 1250) may reconstruct an MR image based on the primary imaging data and the secondary imaging data.

In some embodiments, the processing device 140 may fuse the primary imaging data and the secondary imaging data and reconstruct the MR image based on the fused data. The processing device 140 may fuse the primary imaging data and the secondary data in image domain or in k-space domain.

In some embodiments, the processing device 140 may fuse primary data in mage domain corresponding to the primary imaging data and secondary data in image domain corresponding to the secondary imaging data and reconstruct the MR image based on the fused data in image domain. For example, the processing device 140 may reconstruct a first image based on the primary imaging data and reconstruct a second image based on the secondary imaging data. Further, the processing device 140 may generate the MR image by combining the first image and the second image.

In some embodiments, the processing device 140 may fuse a k-space corresponding to the primary imaging data and a k-space corresponding to the secondary imaging data and reconstruct the MR image based on the fused k-space. For example, the processing device 140 may determine a first k-space based on the primary imaging data and a second k-space based on the secondary imaging data. Further, the processing device 140 may determine a combined k-space based on the first k-space and the second k-space and reconstruct the MR image based on the combined k-space. Specifically, the processing device 140 may fill the primary imaging data into central region(s) (which may affect signal-to-noise and/or contrast of the MR image) of the k-space and the secondary imaging data into outer peripheral region(s) (which may affect sharpness of the MR image) of the k-space. Further, the processing device 140 may obtain the combined k-space by performing a weighted fitting operation on the first k-space and the second k-space. Furthermore, the processing device 140 may obtain the MR image by performing a Fourier transform on the combined k-space.

In some embodiments, as described in combination with operation 530, the processing device 140 may reconstruct the MR image based on the primary imaging data and the secondary imaging data according to a preset image reconstruction algorithm. In some embodiments, the processing device 140 may reconstruct the MR image based on the primary imaging data and the secondary imaging data according to a trained image reconstruction model. More descriptions regarding the reconstruction of the MR image may be found elsewhere in the present disclosure (e.g., FIG. 5 and the descriptions thereof).

In some embodiments, the present disclosure may also provide a computer readable storage medium storing a computer program. When the computer program is executed by a processor, a process (e.g., process 500, process 800, process 900, process 1400) described elsewhere in the present disclosure may be implemented.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this disclosure are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer readable media having computer readable program code embodied thereon.

A computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction performing system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB.NET, Python or the like, conventional procedural programming languages, such as the "C" programming language, Visual Basic, Fortran 2103, Perl, COBOL 2102, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed subject matter requires more features than are expressly recited in each claim. Rather, inventive embodiments lie in less than all features of a single foregoing disclosed embodiment.

In some embodiments, the numbers expressing quantities or properties used to describe and claim certain embodiments of the application are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

We claim:

1. A method for magnetic resonance imaging, implemented on a computing device including a processor and a storage, comprising:
    obtaining primary imaging data associated with a region of interest (ROI) of a subject, wherein the primary imaging data is acquired based on a first sequence during an imaging period when the ROI is in a preset state;
    obtaining secondary data associated with the ROI, wherein the secondary data is acquired based on a second sequence during a waiting period when the ROI is in a non-preset state, wherein
        the imaging period and the waiting period correspond to a same magnetic resonance scanning process, and the imaging period and the waiting period are adjacent;
        determining secondary imaging data based on the secondary data by using a trained model,
    fusing the primary imaging data and the secondary imaging data; and
    reconstructing the magnetic resonance image based on the fused data.

2. The method of claim 1, wherein the method further includes:
    monitoring a physiological motion of the subject; and
    determining the imaging period and the waiting period based on an amplitude of the physiological motion of the subject.

3. The method of claim 2, wherein the determining the imaging period and the waiting period based on the amplitude of the physiological motion of the subject includes:
    determining a period during which the amplitude of the physiological motion of the subject is less than or equal to a threshold as the imaging period; and
    determining a period during which the amplitude of the physiological motion of the subject is larger than the threshold as the waiting period.

4. The method of claim 1, wherein
    the ROI includes a first sub-ROI and a second sub-ROI;
    the primary imaging data is associated with the first sub-ROI; and
    the secondary data is associated with the second sub-ROI.

5. The method of claim 1, wherein the trained model includes an artificial neural network model.

6. The method of claim 1, wherein the reconstructing the magnetic resonance image based on the primary imaging data and the secondary imaging data includes:
    determining a first k-space based on the primary imaging data;
    determining a second k-space based on the secondary imaging data;
    determining a combined k-space based on the first k-space and the second k-space; and
    reconstructing the magnetic resonance image based on the combined k-space.

7. The method of claim 1, wherein the secondary data includes at least one of a motion state curve, contour information associated with the ROI, topogram image information associated with the ROI, or data associated with a sub-region of the ROI with a physiological motion amplitude less than a threshold.

8. The method of claim 1, wherein the secondary imaging data includes at least one of a sensitivity distribution of an RF coil or k-space high-frequency information.

9. The method of claim 8, wherein a type of the trained model is determined based on a data type of the secondary imaging data, and the trained model includes a sensitivity distribution model or a k-space high-frequency model.

10. The method of claim 1, wherein a collection time of the secondary data is determined based on a data type of the secondary data.

11. The method of claim 1, wherein the first sequence is determined based on a scanning and/or an imaging requirement, and the second sequence is determined based on a data type of the secondary data.

12. The method of claim 1, wherein the first sequence includes a fast spin echo (FSE) sequence and the second sequence includes a gradient echo sequence.

13. A system for magnetic resonance imaging, comprising:
    at least one storage medium including a set of instructions; and
    at least one processor in communication with the at least one storage medium, wherein when executing the set of instructions, the at least one processor is directed to cause the system to:
        obtain primary imaging data associated with a region of interest (ROI) of a subject, wherein the primary imaging data is acquired based on a first sequence during an imaging period when the ROI is in a preset state;

obtain secondary data associated with the ROI, wherein the secondary data is acquired based on a second sequence during a waiting period when the ROI is in a non-preset state, wherein the imaging period and the waiting period correspond to a same magnetic resonance scanning process, and the imaging period and the waiting period are adjacent;

determine secondary imaging data based on the secondary data by using a trained model, fuse the primary imaging data and the secondary imaging data; and reconstruct the magnetic resonance image based on the fused data.

14. The system of claim 13, wherein the at least one processor is directed to cause the system further to:

monitor a physiological motion of the subject; and determine the imaging period and the waiting period based on an amplitude of the physiological motion of the subject.

15. The system of claim 14, wherein to determine the imaging period and the waiting period based on the amplitude of the physiological motion of the subject, the at least one processor is directed to cause the system further to:

determine a period during which the amplitude of the physiological motion of the subject is less than or equal to a threshold as the imaging period; and determine a period during which the amplitude of the physiological motion of the subject is larger than the threshold as the waiting period.

16. The system of claim 13, wherein the ROI includes a first sub-ROI and a second sub-ROI;

the primary imaging data is associated with the first sub-ROI; and the secondary data is associated with the second sub-ROI.

17. The system of claim 13, wherein to reconstruct the magnetic resonance image based on the primary imaging data and the secondary imaging data, the at least one processor is directed to cause the system further to:

determine a first k-space based on the primary imaging data;

determine a second k-space based on the secondary imaging data;

determine a combined k-space based on the first k-space and the second k-space; and reconstruct the magnetic resonance image based on the combined k-space.

18. A non-transitory computer readable medium, comprising executable instructions that, when executed by at least one processor, direct the at least one processor to perform a method, the method comprising:

obtaining primary imaging data associated with a region of interest (ROI) of a subject, wherein the primary imaging data is acquired based on a first sequence during an imaging period when the ROI is in a preset state;

obtaining secondary data associated with the ROI, wherein the secondary data is acquired based on a second sequence during a waiting period when the ROI is in a non-preset state, wherein the imaging period and the waiting period correspond to a same magnetic resonance scanning process, and the imaging period and the waiting period are adjacent;

determining secondary imaging data based on the secondary data by using a trained model; and fusing the primary imaging data and the secondary imaging data; and reconstructing the magnetic resonance image based on the fused data.

* * * * *